United States Patent
Ota et al.

(10) Patent No.: US 11,855,242 B2
(45) Date of Patent: Dec. 26, 2023

(54) LIGHT EMITTING DEVICE AND METHOD OF MANUFACTURING THE SAME

(71) Applicant: NICHIA CORPORATION, Anan (JP)

(72) Inventors: Akihiro Ota, Duluth, GA (US); Takuya Nagamoto, Tokushima (JP)

(73) Assignee: NICHIA CORPORATION, Anan (JP)

(*) Notice: Subject to any disclaimer, the term of this patent is extended or adjusted under 35 U.S.C. 154(b) by 143 days.

(21) Appl. No.: 17/505,400

(22) Filed: Oct. 19, 2021

(65) Prior Publication Data

US 2022/0037565 A1 Feb. 3, 2022

Related U.S. Application Data

(63) Continuation of application No. 16/543,454, filed on Aug. 16, 2019, now Pat. No. 11,171,268.

(30) Foreign Application Priority Data

Sep. 26, 2018 (JP) .................................. 2018-179935
Jan. 29, 2019 (JP) .................................. 2019-012949

(51) Int. Cl.
*H01L 33/50* (2010.01)
*H01L 33/58* (2010.01)
*H01L 33/60* (2010.01)

(52) U.S. Cl.
CPC .......... *H01L 33/505* (2013.01); *H01L 33/502* (2013.01); *H01L 33/58* (2013.01);
(Continued)

(58) Field of Classification Search
CPC .................. H01L 33/60; H01L 33/502; H01L 2933/0041
See application file for complete search history.

(56) References Cited

U.S. PATENT DOCUMENTS

2012/0320607 A1 12/2012 Kinomoto et al.
2013/0107535 A1* 5/2013 Matsuwaki ........... F21V 29/773
362/260
(Continued)

FOREIGN PATENT DOCUMENTS

CN 107968141 A 4/2018
JP 2016-086111 A 5/2016
(Continued)

OTHER PUBLICATIONS

Final Office Action on U.S. Appl. No. 16/543,454 dated Mar. 4, 2021.
(Continued)

*Primary Examiner* — Jay C Chang
*Assistant Examiner* — Mikka Liu
(74) *Attorney, Agent, or Firm* — Foley & Lardner LLP

(57) ABSTRACT

A light emitting device includes: a light emitting element; a wavelength conversion member including: a wavelength conversion portion arranged on or above an upper surface of the light emitting element, and a light-transmissive portion, wherein, in a plan view, the light-transmissive portion surrounds at least one or more lateral surfaces of the wavelength conversion portion; a sealing member comprising a lens portion that is arranged on or above an upper surface of the wavelength conversion member; and a light reflection member that surrounds one or more lateral surfaces of the wavelength conversion member. In a plan view, the wavelength conversion member is inside a perimeter of the lens portion.

20 Claims, 17 Drawing Sheets

(52) U.S. Cl.
CPC ...... *H01L 33/60* (2013.01); *H01L 2933/0041* (2013.01); *H01L 2933/0058* (2013.01)

(56) References Cited

U.S. PATENT DOCUMENTS

| | | |
|---|---|---|
| 2014/0048821 A1 | 2/2014 | Inoue et al. |
| 2015/0236203 A1 | 8/2015 | Oh et al. |
| 2017/0033267 A1 | 2/2017 | Tamaki et al. |
| 2017/0069801 A1 | 3/2017 | Oka et al. |
| 2018/0212128 A1 | 7/2018 | Hayashi |

FOREIGN PATENT DOCUMENTS

| | | |
|---|---|---|
| JP | 2017-033967 A | 2/2017 |
| JP | 2018-049875 A | 3/2018 |

OTHER PUBLICATIONS

Non-Final Office Action on U.S. Appl. No. 16/543,454 dated Aug. 7, 2020.

Notice of Allowance on U.S. Appl. No. 16/543,454 dated Jul. 14, 2021.

* cited by examiner

LIGHT EMITTING DEVICE AND METHOD OF MANUFACTURING THE SAME

CROSS-REFERENCE TO RELATED APPLICATIONS

The present application is a continuation of U.S. patent application Ser. No. 16/543,454, filed on Aug. 16, 2019, which claims priority under 35 U.S.C. § 119 to Japanese Patent Application No. 2019-012949, filed on Jan. 29, 2019, and Japanese Patent Application No. 2018-179935, filed on Sep. 26, 2018, the contents of which are incorporated herein by reference in their entireties.

BACKGROUND

The present disclosure relates to a light emitting device, and a method for manufacturing the light emitting device.

Light emitting devices are known that include a light emitting element together with a phosphor to emit mixed color light. Such light emitting devices are used for lighting fixtures and liquid crystal display backlights.

For example, a light emitting device is known that includes a light emitting element for emitting blue light, and a phosphor for emitting yellow light.

In such a light emitting device, its chromaticity will vary in accordance with viewer's angle, in other words, so-called color unevenness will occur. In order to reduce color unevenness, a light-diffusing material can be mixed in a phosphor layer that includes a phosphor.

Because the light-diffusing material will evenly diffuse light, this light emitting device can be expected to have reduced color unevenness in light distribution (see Japanese Patent Publication No. JP 2018-49875).

SUMMARY

However, the light-diffusing material not only diffuses but also absorbs light. Such absorption causes loss of light. As a result, the luminous flux of the light emitting device will decrease. Hence, there is a need of a light source that has improved color unevenness without reducing its luminous flux.

Therefore, it is an object of certain embodiments of the present invention to provide a light emitting device that has improved color unevenness but suppresses luminous flux reduction.

A light emitting device according to one aspect of the present invention includes a support member, a light emitting element, a wavelength conversion member, a light reflection member, and a light-transmissive member. The light emitting element is mounted on the support member. The wavelength conversion member is arranged on or above the light emitting element, and larger than the light emitting element as viewed in a plan view. The wavelength conversion member includes a wavelength conversion portion arranged on or above the light emitting element, and a light-transmissive portion that is arranged around the wavelength conversion portion. The light reflection member is spaced away from the side surfaces of the wavelength conversion member and the light emitting element and arranged on or above the support member. The light-transmissive member is arranged between the light reflection member and the side surface(s) of the light emitting element, and is in contact with a part of the light-transmissive portion of the wavelength conversion member and the side surface(s) of the light emitting element.

A method for manufacturing a light emitting device according to another aspect of the present invention includes a wavelength conversion member preparation step, a wavelength conversion member arrangement step, a light-transmissive member arrangement step, and a light reflection member arrangement step. The light emitting device includes a support member, a light emitting element, a wavelength conversion member, and a light reflection member. The light emitting element is mounted on the support member. The wavelength conversion member is arranged on or above the light emitting element, and is larger than the light emitting element as viewed in a plan view. The light reflection member is arranged on or above the support member. In the wavelength conversion member preparation step, the wavelength conversion member is prepared that includes a wavelength conversion portion that includes a phosphor, and a light-transmissive portion that is arranged around the wavelength conversion portion. In the wavelength conversion member arrangement step, the wavelength conversion member is arranged on or above the light emitting element that is mounted on the support member. In the light-transmissive member arrangement step, a light-transmissive member is arranged on or above the support member so as to cover a part of the light-transmissive portion and the side surface(s) of the light emitting element. In the light reflection member arrangement step, the light reflection member is arranged on or above the support member so as to cover the side surfaces of the wavelength conversion member and the light-transmissive member.

According to certain embodiments of the present disclosure, a light emitting device can be provided that has improved color unevenness but suppresses luminous flux reduction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, in which.

DETAILED DESCRIPTION

Figure 1:
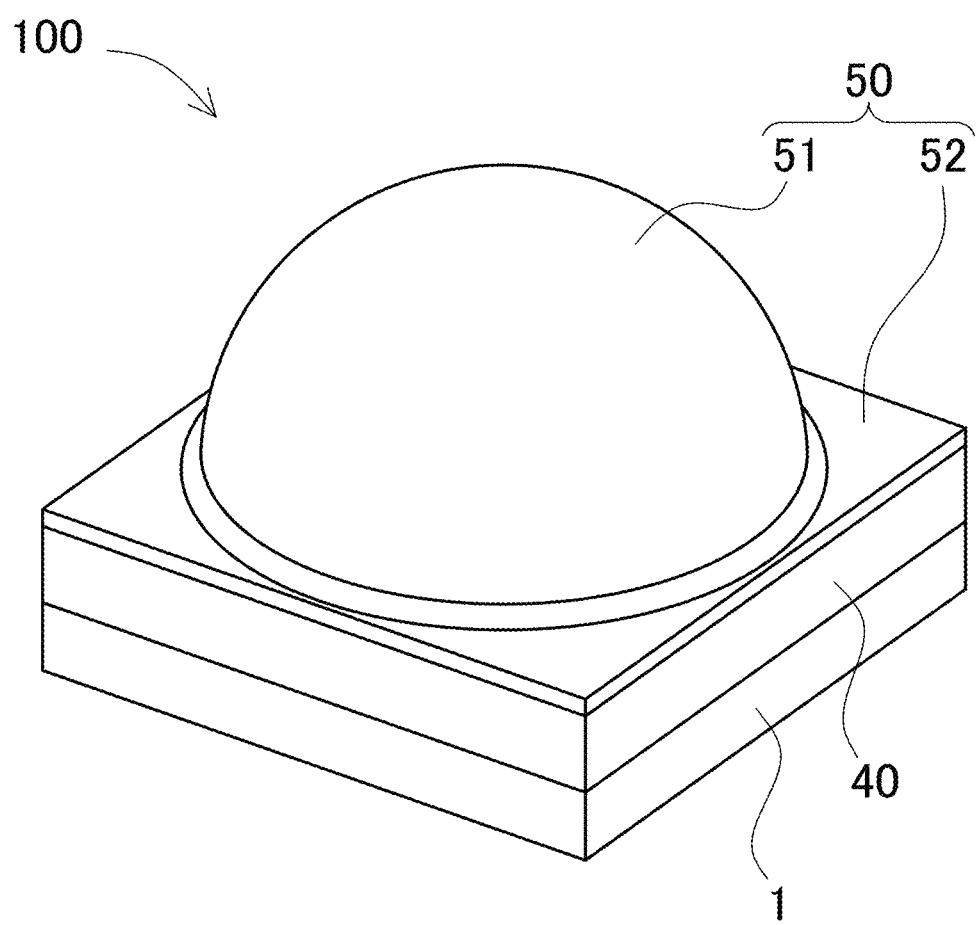
FIG. 1 is a perspective view showing a light emitting device according to a first embodiment of the present invention.

Embodiments will now be described with reference to the accompanying drawings, wherein like reference numerals designate corresponding or identical elements throughout the various drawings.

A light emitting device according to an embodiment of the present invention includes a support member, a light emitting element, and a wavelength conversion member, a light reflection member. The light emitting element is mounted on the support member. The wavelength conversion member is arranged on or above the light emitting element, and is larger than the light emitting element as viewed in a plan view. The light reflection member is spaced away from the side surfaces of the wavelength conversion member and the light emitting element, and is arranged on or above the support member. The wavelength conversion member includes a wavelength conversion portion arranged on or above the upper surface of the light emitting element, and a light-transmissive portion that is arranged around the wavelength conversion portion. The light emitting device further includes a light-transmissive member that is arranged between the light reflection member and the side surface(s) of the light emitting element, and is in contact with a part of the light-transmissive portion of the wavelength conversion member and the side surface(s) of the light emitting element.

According to this arrangement, a space is formed that extends from the side surface(s) of the light emitting element to the side surfaces of the wavelength conversion portion, and is occupied by the light-transmissive member and the light-transmissive portion of the wavelength conversion member so that light emitted by the light emitting element can pass through the light-transmissive member and the light-transmissive portion without its wavelength being converted by the wavelength conversion portion. As a result, color unevenness on the periphery of the wavelength conversion portion can be reduced that has been a problem in conventional light emitting devices including such a wavelength conversion portion. Because the color unevenness can be reduced based on the principle that does not use diffusion, luminous flux reduction can be prevented. Therefore, the color unevenness can be improved without luminous flux reduction.

According to a light emitting device of another embodiment of the present invention, it is preferable that the light-transmissive member includes a light-transmissive bonding member that is interposed between the light emitting element and the wavelength conversion member, and that a part of the light-transmissive bonding member extends from an interface between the light emitting element and the wavelength conversion member to the peripheral part defined by the side surface(s) of the light emitting element and a main surface of the wavelength conversion member that is located on the light emitting element side. The part of the light-transmissive bonding member that extends from the interface is in contact with the part of the light-transmissive portion. According to this arrangement, because the light-transmissive member also serves as the bonding member, the number of components can be reduced.

According to a light emitting device of another embodiment of the present invention, the light-transmissive bonding member can have a roughly inverted triangular shape that expands toward the light-transmissive portion as viewed in a cross-sectional side view. In this arrangement, an inclined surface(s) can be provided by such a roughly inverted triangular shape. The inclined surface can reflect light emitted by the light emitting element.

According to a light emitting device of another embodiment of the present invention, a sealing member can further be included that includes a hemispherical lens portion and a flange portion. The hemispherical lens portion is arranged on or above the upper surface of the wavelength conversion member, and has a circular shape as viewed in a plan view and a semicircular shape as viewed in a cross-sectional view. The flange portion protrudes from the outer periphery of the lens portion.

According to a light emitting device of another embodiment of the present invention, the wavelength conversion member can have a cylindrical shape. In this arrangement, the color unevenness can be improved.

According to a light emitting device of another embodiment of the present invention, the light-transmissive portion can be arranged on the side and the upper surfaces of the wavelength conversion portion, and the light-transmissive portion can form the upper surface part of the wavelength conversion member.

According to a light emitting device of another embodiment of the present invention, the upper surface of the wavelength conversion member can include the upper surfaces of the wavelength conversion portion and the light-transmissive portion that is arranged around the wavelength conversion portion.

A method for manufacturing a light emitting device according to an embodiment of the present invention includes a wavelength conversion member preparation step, a wavelength conversion member arrangement step, a light-transmissive member arrangement step, and a light reflection member arrangement step. The light emitting device includes a support member, a light emitting element, a wavelength conversion member, and a light reflection member. The light emitting element is mounted on the support member. The wavelength conversion member is arranged on or above the light emitting element, and is larger than the light emitting element as viewed in a plan view. The light reflection member is arranged on or above the support member. In the wavelength conversion member preparation step, the wavelength conversion member material is prepared that includes a wavelength conversion portion that includes a phosphor, and a light-transmissive portion that is arranged around the wavelength conversion portion. In the wavelength conversion member arrangement step, the wavelength conversion member is arranged on or above the light emitting element that is mounted on the support member. In the light-transmissive member arrangement step, the light-transmissive member is arranged on or above the support member so as to cover a part of the light-transmissive portion and the side surface(s) of the light emitting element. In the light reflection member arrangement step, the light reflection member is arranged on or above the support member so as to cover the side surfaces of the wavelength conversion member and the light-transmissive member.

According to a method for manufacturing a light emitting device of another embodiment of the present invention, a bonding member formation step can be further included. In the bonding member formation step, a bonding member is formed that bonds the wavelength conversion member to the light emitting element by applying a light-transmissive bonding material between the wavelength conversion member and the light emitting element that is mounted on the support member, and spreading the light-transmissive bonding material so that a part of the light-transmissive bonding material covers the part of the light-transmissive portion and the side surface(s) of the light emitting element. In this case, the wavelength conversion member can be bonded onto the light emitting element simultaneously with the light-transmissive member arrangement step. Therefore, the number of steps can be reduced in the method for manufacturing a light emitting device.

According to a method for manufacturing a light emitting device of another embodiment of the present invention, the wavelength conversion member preparation step can includes a light-transmissive member preparation step and a recessed part filler step. In the light-transmissive member preparation step, a light-transmissive member material that has a recessed part(s) is prepared. In the recessed part filler step, the recessed part(s) is/are filled with a material including the phosphor whereby forming the wavelength conversion member including the wavelength conversion portion, which includes the phosphor, and the light-transmissive portion, which is arranged around the wavelength conversion portion. In this case, the wavelength conversion member that includes the light-transmissive portion and the wavelength conversion portion can be easily formed.

According to a method for manufacturing a light emitting device of another embodiment of the present invention, the light-transmissive member preparation step can include a step for preparing the light-transmissive member material that have a plurality of recessed parts. In addition, the wavelength conversion member preparation step can include a step for forming a plurality of wavelength conversion members by dividing the light-transmissive member material into pieces so that each piece includes the wavelength conversion portion, which includes the phosphor, and the light-transmissive portion. Additionally, the bonding member formation step can include a step for bonding the plurality of wavelength conversion members to their corresponding light emitting element, which is mounted on its support member.

According to a method for manufacturing a light emitting device of another embodiment of the present invention, the wavelength conversion member preparation step can include a light-transmissive member preparation step, an opening formation step, and an opening filler step. In the light-transmissive member preparation step, the light-transmissive member material is prepared. In the opening formation step, an opening(s) is/are formed in the light-transmissive member. In the opening filler step, the opening(s) is/are filled with a material including the phosphor whereby forming the wavelength conversion member. The wavelength conversion member includes the wavelength conversion portion, which includes the phosphor, and the light-transmissive portion, which is arranged around the wavelength conversion portion.

According to a method for manufacturing a light emitting device of another embodiment of the present invention, the wavelength conversion member preparation step can include a plate preparation step, a groove formation step, and a light-transmissive resin material placement step. In the plate preparation step, a plate is prepared that is formed of resin including the phosphor. In the groove formation step, a groove(s) is/are formed in the plate formed of the resin including the phosphor. In the light-transmissive resin material placement step, a light-trans missive resin material is placed in the groove(s) whereby forming the wavelength conversion member. The wavelength conversion member includes the wavelength conversion portion, which includes the phosphor, and the light-transmissive portion, which is arranged around the wavelength conversion portion.

The following description will describe embodiments and examples according to the present invention with reference to the drawings. It should be appreciated, however, that the embodiments and examples described below are illustrations of a light emitting device and a method for manufacturing a light emitting device to give a concrete form to technical ideas of the invention, and a light emitting device and a method for manufacturing a light emitting device of the invention are not specifically limited to description below. Additionally, the sizes and the arrangement relationships of the members in the drawings are occasionally exaggerated for ease of explanation. The same or similar members are provided with the same designation and the same reference numerals, and their repeated description is omitted. In addition, a plurality of elements in the embodiments and examples of the present disclosure may be configured as a single element that serves the purpose of the plurality of elements, and a single element may be configured as a plurality of elements that serve the purpose of the single element. Also, the description of some of examples or embodiments may be applied to other examples, embodiments or the like. In the following description, although terms for indicating particular directions or positions (e.g., "upper" and "lower", "right", "left", and other terms including these terms) will be used as necessary for ease of understanding the present with reference to the drawings, the technical scope of the present invention is not limited by these terms. The term "comprising" a member used in this specification means that the member may be either a separate member or a unitary member.

First Embodiment

Figure 2:
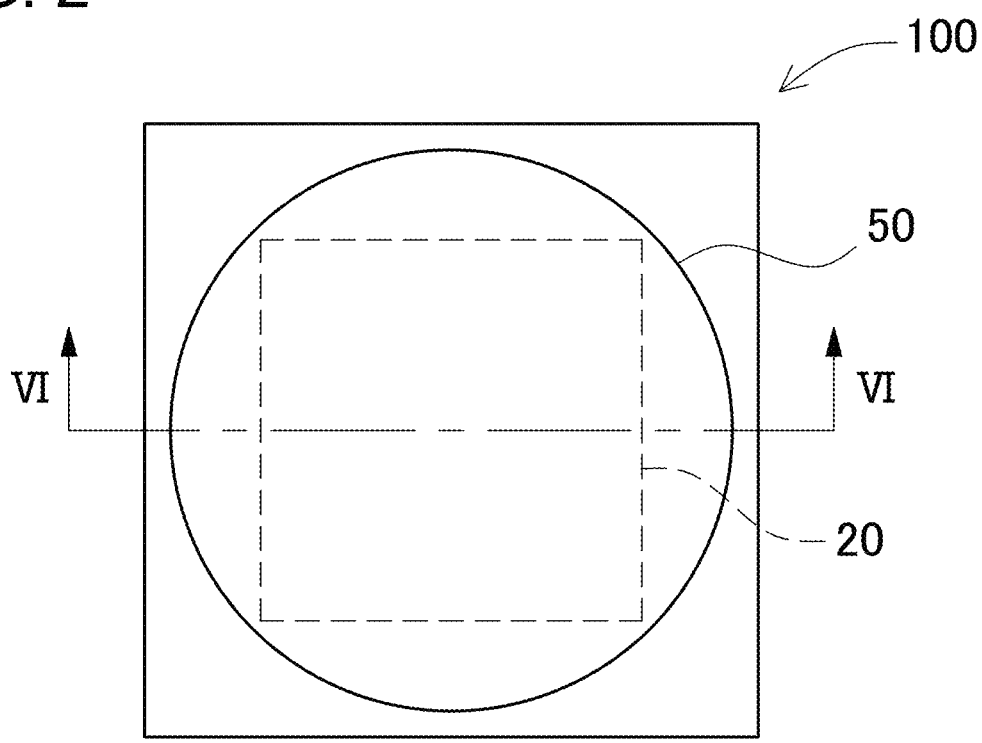
FIG. 2 is a plan view showing a light emitting device according to the first embodiment of the present invention.
Figure 3:
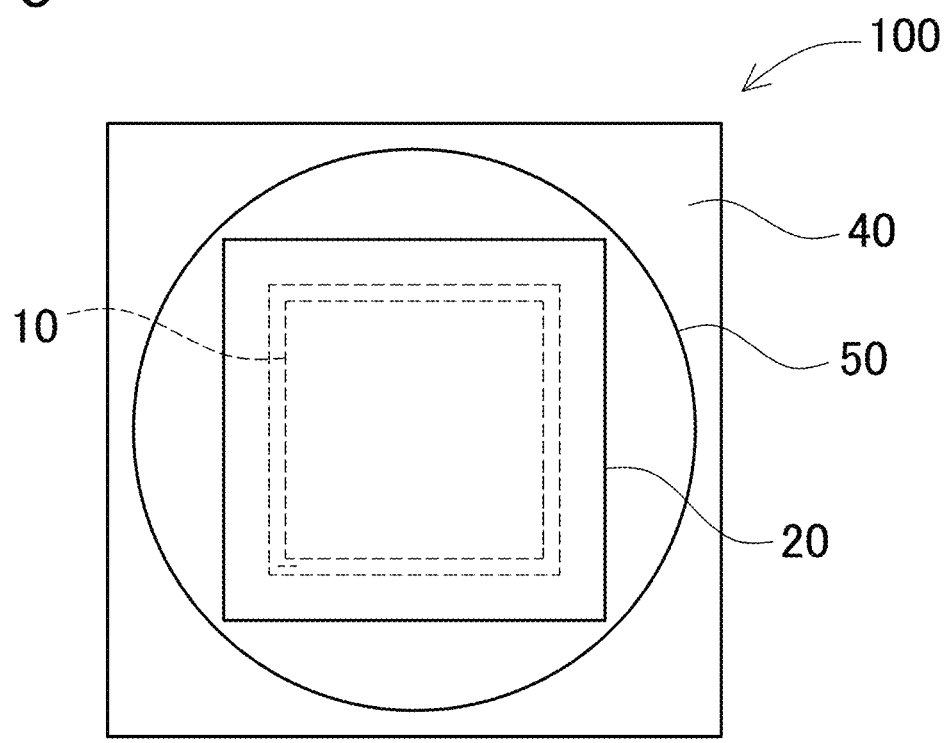
FIG. 3 is a plan view showing the light emitting device of FIG. 2 with lower members being shown by dashed lines.
Figure 4:
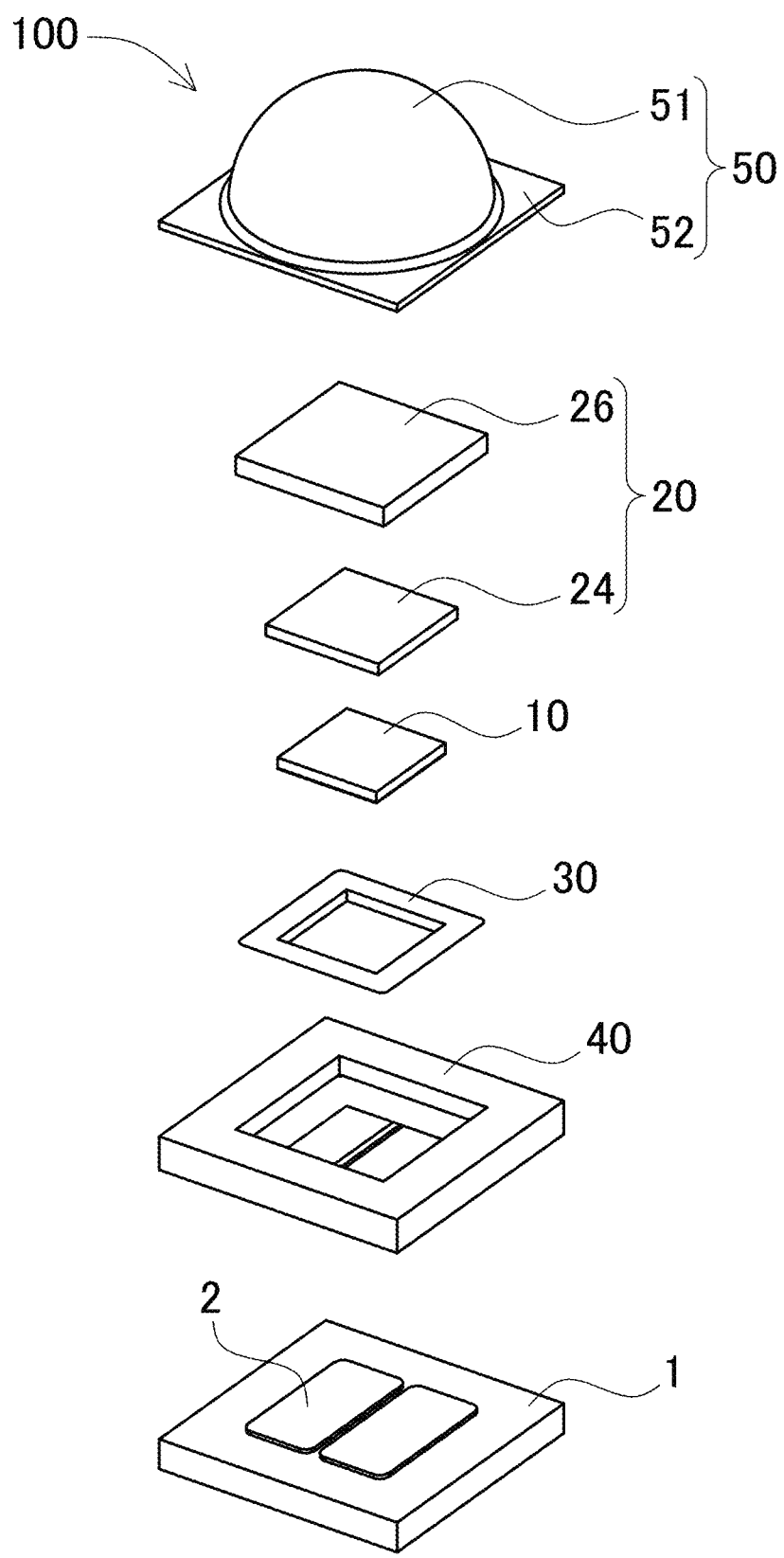
FIG. 4 is an exploded perspective view showing the light emitting device shown in FIG. 1.
Figure 5:
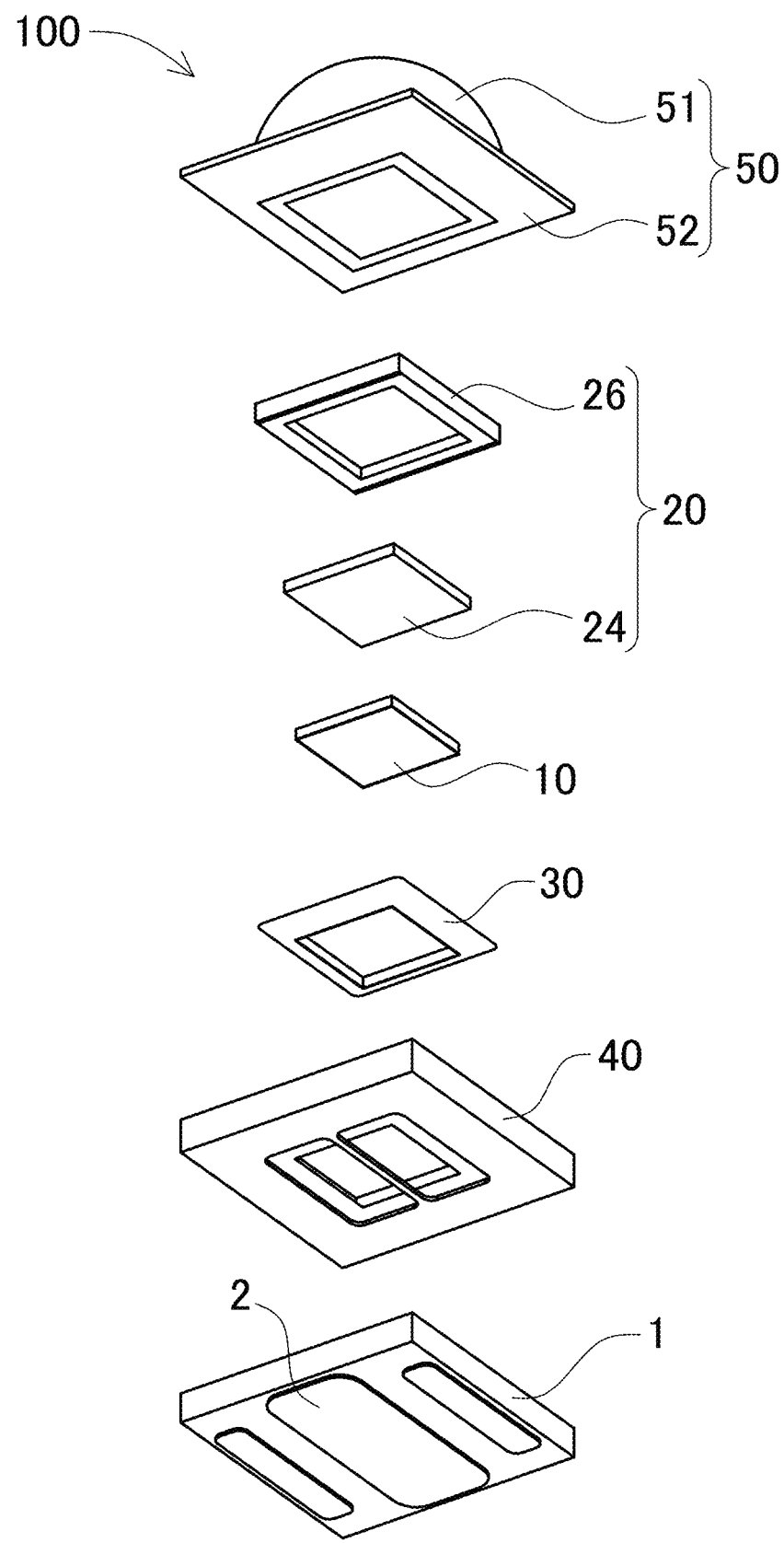
FIG. 5 is an exploded perspective view showing the light emitting device shown in FIG. 1 as viewed from the bottom side.
Figure 6:
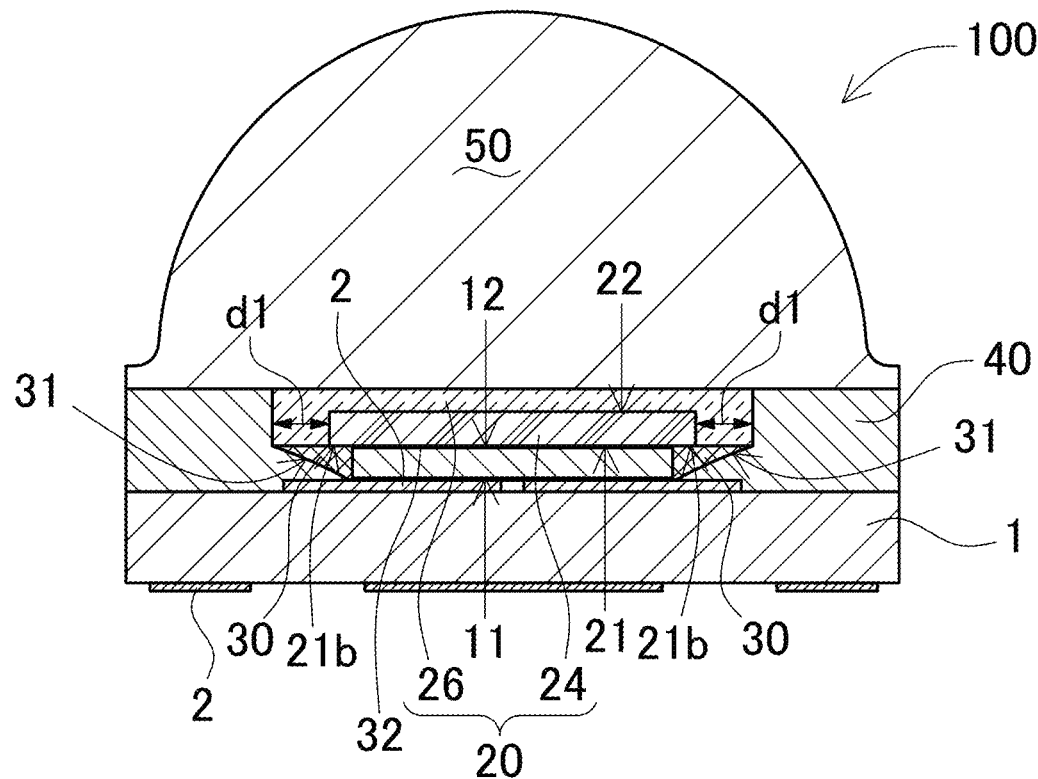
FIG. 6 is a cross-sectional view showing the light emitting device shown in FIG. 1 taken along the line VI-VI.
Figure 7:
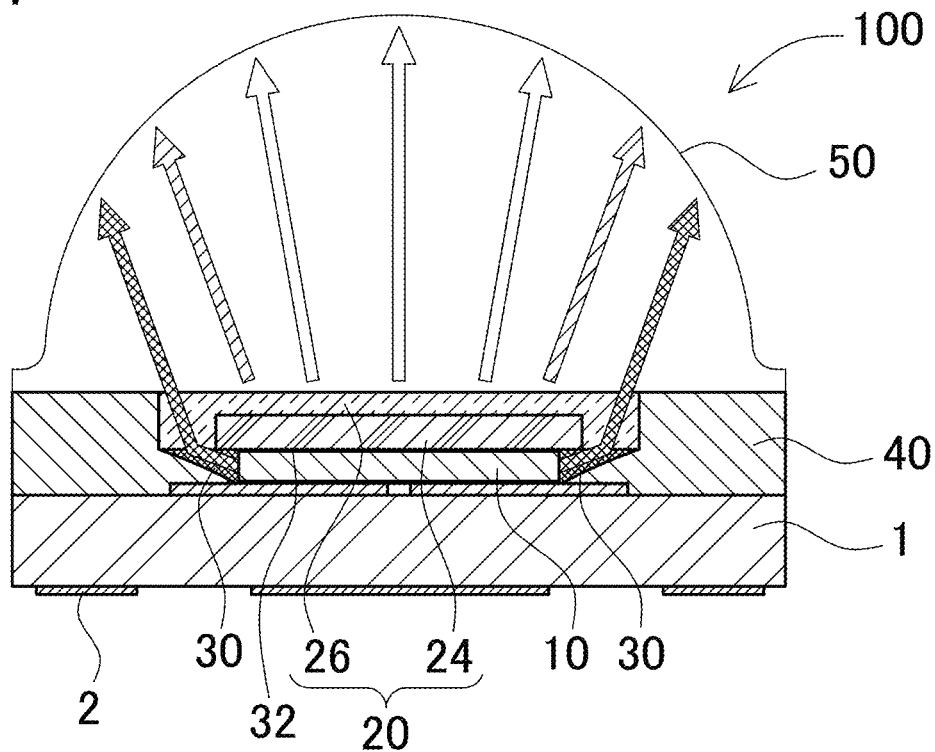
FIG. 7 is a cross-sectional view schematically showing the travelling directions of light in the view of FIG. 6.

A light emitting device 100 according to a first embodiment of the present invention is now described with reference to FIGS. 1 to 7. FIG. 1 is a perspective view showing the light emitting device 100 according to the first embodiment of the present invention. FIG. 2 is a plan view showing the light emitting device 100 according to the first embodiment of the present invention. FIG. 3 is a plan view showing the light emitting device 100 of FIG. 2 with lower members being shown by dashed lines. FIG. 4 is an exploded perspective view showing the light emitting device 100 shown in FIG. 1. FIG. 5 is an exploded perspective view showing the light emitting device 100 shown in FIG. 1 as viewed from the bottom side. FIG. 6 is a cross-sectional view showing the light emitting device 100 shown in FIG. 2 taken along the line VI-VI. FIG. 7 is a cross-sectional view schematically showing the travelling directions of light in the view of FIG. 6. The illustrated light emitting device 100 includes a support member 1, a light emitting element 10, a wavelength conversion member 20, and a light reflection member 40. The light emitting element 10 is mounted on the support member 1. The wavelength conversion member 20 is arranged on the upper surface of the light emitting element 10. The light reflection member 40 is spaced away from the side surfaces of the wavelength conversion member 20 and the light emitting element 10, and is arranged on the support member 1. A sealing member 50 is arranged on the upper surface of the wavelength conversion member 20. The sealing member 50 includes a hemispherical lens portion 51 and a flange portion 52. The hemispherical lens portion 51 has a circular shape as viewed in a plan view and a semicircular shape as viewed in a cross-sectional view. The flange portion 52 protrudes from the outer periphery of the lens portion 51. The circular shape of the lens portion 51 as viewed in a plan view can be seen in FIGS. 1 to 3. The semicircular shape as viewed in a cross-sectional view can be seen in FIGS. 4 to 6. The flange portion 52 protrudes outward from the outer periphery of the lens portion 51.

The wavelength conversion member 20 is larger than the light emitting element 10 as viewed in a plan view, as shown in FIG. 3. The wavelength conversion member 20 includes a wavelength conversion portion 24 that is arranged on the upper surface of the light emitting element 10, and a light-transmissive portion 26 that is arranged around the wavelength conversion portion 24, as shown in the cross-sectional view of FIG. 6. The light emitting device further includes a light-transmissive member 30 that is arranged between the light reflection member 40 and the side surfaces of the light emitting element 10, and is in contact with a part of the light-transmissive portion 26 of the wavelength conversion member 20 and the side surfaces of the light emitting element 10.

According to this arrangement, space is formed that extends from the side surfaces of the light emitting element 10 to the side surfaces of the wavelength conversion portion 24, and is occupied by the light-transmissive member 30 and the light-transmissive portion 26 of the wavelength conversion member 20 so that light from the light emitting element 10 can pass through the light-transmissive member 30 and the light-transmissive portion 26 without its wavelength being converted by the wavelength conversion portion 24. As a result, color unevenness on the periphery of the wavelength conversion portion 24 can be reduced that has been a problem in conventional light emitting devices including such a wavelength conversion portion. Because the color unevenness can be reduced based on the principle that does not use diffusion, luminous flux reduction can be prevented. Therefore, the color unevenness can be improved without luminous flux reduction.

(Light-Transmissive Member 30)

The light-transmissive member 30 includes a light-transmissive bonding member 32 that is interposed between the light emitting element 10 and the wavelength conversion member 20. The light-transmissive bonding member 32 can also serve as a bonding material for bonding the wavelength conversion member 20 to the light emitting element 10. A part of the light-transmissive bonding member 32 may extend from the interface between the light emitting element 10 and the wavelength conversion member 20 to the peripheral part defined by the side surfaces of the light emitting element 10 and a main surface of the wavelength conversion member 20. The main surface of the wavelength conversion member 20 is located on the light emitting element 10 side. The light-transmissive bonding member 32 can have a roughly inverted triangular shape that expands toward the light-transmissive portion 26 as viewed in a cross-sectional side view as shown in FIG. 6.

Although the light emitting device is shown in the exploded perspective views of FIGS. 4 and 5 for ease of understanding, the components are not necessarily detachable. The light emitting device can be formed by curing previously softened materials, and such a light emitting device falls within the scope of the present invention. That is, the light emitting device according to the present invention is not limited to a light emitting device that can be taken apart into the illustrated components.

(Light Distribution Color Unevenness)

Generally, there is likely to be a trade-off between the increase in the luminous flux of the light emitting device and the increase of the light distribution color unevenness. For example, the case is considered where a blue LED as the light emitting element is used together with a plate that includes a YAG phosphor to be excited by blue light and emit yellow light as the wavelength conversion member. The plate that includes the YAG phosphor has a larger area than the blue LED, and is arranged on the upper surface of the blue LED. A light reflection member covers the side surfaces of the plate that includes the YAG phosphor. Color-mixed white light can be thus emitted by mixing the blue light emitted by the blue LED and the yellow light converted in wavelength by the wavelength conversion member. In such an arrangement, if the luminous flux of the blue LED is increased, so-called a yellow ring will appear in which light on the peripheral part of the wavelength conversion member is perceived yellowish white relative to the central part. This is caused by the optical path length difference. In the central part of the wavelength conversion member, because the length of a path of light is shorter, the blue light component will be relatively high. In the peripheral part of the wavelength conversion member, because the length of a path of light is longer, the yellow light component will be relatively high. Such light distribution color unevenness is increased by increasing the output (i.e., luminous flux) of the light emitting element. If the luminous flux is reduced, the light distribution color unevenness can be reduced but the output is reduced. For this reason, the luminous flux is adjusted in consideration of the trade-off between them in such conventional light emitting devices.

Contrary to such conventional light emitting devices, the light emitting device 100 according to this embodiment intentionally increases leakage of light emitted by the light emitting element 10 on the outer periphery of the wavelength conversion member 20. As a result, the increase of the wavelength-converted light (yellow light in the illustrated light emitting device) that is emitted by the wavelength conversion member 20 can be reduced. Therefore, large color unevenness can be prevented even if the luminous flux is increased. Specifically, as shown in FIG. 7, around the side surface of the light emitting element 10, a path is provided that allows the light emitted by the light emitting element 10 to pass through the light-transmissive portion 26 and go out without passing through the wavelength conversion portion 24 in the wavelength conversion members 20. This path can provide a relatively large component of non-converted light around the edges of the wavelength conversion portion 24. Consequently, the color unevenness that appears in a light emitting device according to a comparative example having the structure used in the conventional light emitting devices can be reduced.

Figure 8:
FIG. 8 shows an image showing the light emission of a light emitting device according to a comparative example.
Figure 9:
FIG. 9 shows an image showing the light emission of the light emitting device according to the first embodiment.

FIGS. 8 and 9 show the simulation result of the light distribution color unevenness of the light emitting devices 800 and 100 according to the comparative example and the first embodiment, respectively. It is found that color unevenness appears in which the yellow component is high around the light emitting device 800 according to the comparative example as shown in FIG. 8, but such color unevenness is reduced on the peripheral part of the light emitting device 100 according to the first embodiment as shown in FIG. 9.

Figure 10:
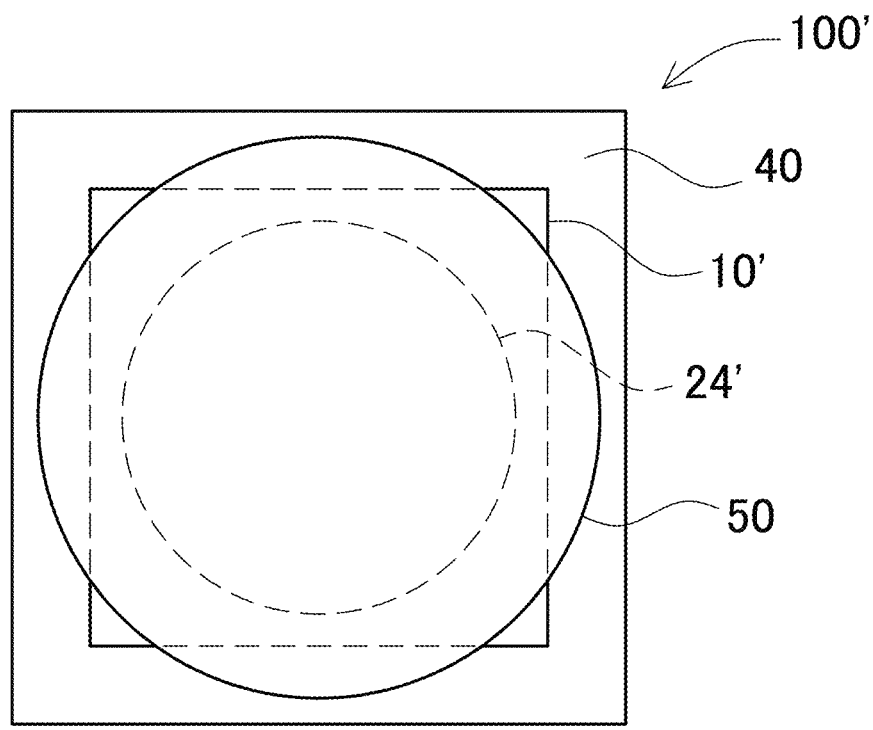
FIG. 10 is a plan view showing a light emitting device according to a modified embodiment.

The wavelength conversion portion 24 is dimensioned larger than the light emitting element 10 as viewed in a plan view so that the light emitting element 10 is not exposed from the wavelength conversion portion 24 when the light emitting element 10 is placed on and bonded to the wavelength conversion portion 24 as discussed above. In other words, because the light emitting element 10 is not exposed from the wavelength conversion portion 24 as viewed in a plan view, the light emitted by the light emitting element 10 is prevented from directly going out without reflection and the like. As a result, color unevenness caused by such direct outgoing light can be prevented. That is, the light emitted by the light emitting element 10 does not directly go out but is reflected by the light reflection member 40 and then exits as indirect light as shown in FIG. 7, etc. As a result, the color unevenness can be prevented in which blue light is perceived around the wavelength conversion portion 24. If color unevenness is large due to the output of the light emitting element, the thickness of the wavelength conversion portion, and the like, the wavelength conversion portion may be smaller than the light emitting element as viewed in a plan view so that a part of the light emitted by the light emitting element directly exits. This type of light emitting device is shown as a light emitting device 100' according to a modified embodiment in a plan view of FIG. 10. In the modified embodiment, the light-transmissive member that provides the path to allow the light emitted by the light emitting element 10' to go out without passing the wavelength conversion portion 24' may be omitted. The components according to the modified embodiment shown in FIG. 10 similar to the foregoing first embodiment are attached with the same reference signs as the first embodiment, and their description is omitted.

(Support Member 1)

The support member 1 holds the light emitting element 10, the sealing member 50 and the like on its upper surface. The support member 1 includes an electrically insulating base material, and an electrically-conducting member 2 such as a circuit pattern onto which the light emitting element 10 is mounted. The electrically-conducting member 2 is formed on the surface of the base material. Examples of the electrically insulating base material for the support member 1 can be provided by ceramics, resins (including resins containing reinforcements such as glass epoxy resin), and the like. Examples of a material for ceramic mounts can be provided by alumina, aluminum nitride, mullite, and the like. Examples of such resins can be provided by thermosetting resins (e.g., epoxy resin, silicone resin, BT resin, polyimide resin, etc.), and thermoplastic resins, (e.g., polyphthalamide resin, nylon resin, etc.). The base material has a single layer or laminated layers. Aluminum nitride is used as the base material in the embodiment shown in FIG. 6, etc. Generally, aluminum nitride has higher heat dissipating performance than resins. For this reason, in the case in which aluminum nitride is used for the base material, the heat dissipating performance of the light emitting device can be improved. In addition, the base material may include a coloring agent, a filler, reinforcements, or the like known in the art. Materials with good reflectance are preferably used as the coloring agent. In particular, white materials such as titanium oxide and zinc oxide are more preferably used. Examples of the filler can be provided by silica, alumina, and the like. The examples of the reinforcements can be provided by glass, calcium silicate, potassium titanate, and the like.

The electrically-conducting member 2 is formed on the upper and lower surfaces of the support member 1 as required. The circuit pattern is formed by the electrically-conducting member 2. The light emitting element 10 is mounted on the circuit pattern. An electrically-conducting member pair 2 is formed on the back surface of the support member 1 in the embodiment shown in FIG. 6, etc. Electrodes that are formed on the light emitting element 10 are connected to the electrically-conducting member pair 2 of the support member 1 by bumps or the like in a flip-chip mounting manner. It is noted that although the light emitting element 10 has been illustratively described to be connected in a flip-chip mounting manner to the support member 1 in the embodiment shown in FIG. 6, etc., the present invention is not limited to this. The light emitting element can be connected by wire bonding, for example, to the support member.

(Light Emitting Element 10)

The light emitting element 10 has a first surface 11 (lower surface in FIG. 6) as mount surface on which the electrodes of the light emitting element are formed, and a second surface 12 (upper surface in FIG. 6) as light emitting surface that is opposite to the first surface 11 of the light emitting element.

In the case in which, as the light emitting element 10, a semiconductor light emitting element that includes nitride group semiconductors ($In_xAl_yGa_{1-x-y}N$ where x and y satisfy 0≤x, 0≤y, x+y≤1) is used, a highly efficient and stable light emitting device that has high output-input linearity and high mechanical shock resistance can be provided.

The light emitting element 10 that has a rectangular shape in a plan view has been illustratively described in the embodiment shown in FIGS. 4, 5, etc. However, the shape of the light emitting element 10 in the present invention is not limited to this. The light emitting element may have a square, rectangle, as well as polygonal shape such as hexagon and octagon, circular or oval shape, or the like, for example.

(Wavelength Conversion Member 20)

The wavelength conversion member 20 shown in FIG. 6 or the like includes the wavelength conversion portion 24 and the light-transmissive portion 26. The wavelength conversion member 20 is arranged on the upper surface of the light emitting element 10, and converts the wavelength of light emitted through the second surface 12 of the light emitting element 10 into a different wavelength. For example, in the case in which the light emitting element 10 emits blue light, the blue light can be converted in wavelength to yellow light whereby emitting white light by mixing the blue light and the yellow light. This wavelength conversion member 20 has a first surface 21 (lower surface in FIG. 6), and a second surface 22 (upper surface in FIG. 6) opposite to the first surface 21. The first surface 21 of the wavelength conversion member 20 has a larger area than the second surface 12 of the light emitting element. According to this arrangement, the entire surface of the second surface 12 of the light emitting element, i.e., the light emitting surface of the light emitting element 10 can be covered by the wavelength conversion member 20. In other words, color unevenness can be reduced caused by light that is emitted by the light emitting element 10 (for example, blue light) and directly exits without mixed with wavelength-converted light if a part of the light emitting surface of the light emitting element 10 is not covered by the wavelength conversion member 20. In the embodiment shown in FIG. 3, a rectangular wavelength conversion member 20 that is slightly larger than a rectangular light emitting element 10 is used.

The wavelength conversion portion 24 of the wavelength conversion member 20 can be constructed of a plate that is formed of resin including a phosphor. The phosphor can be uniformly distributed in the resin, or locally distributed in a part of the resin. The phosphor is excited by light emitted by the light emitting element 10, and emits luminescent radiation with a longer wavelength than the light emitted by the light emitting element 10.

The wavelength conversion member is not limited to this. The wavelength conversion member may be constructed of a transparent glass plate or the like that includes a wavelength conversion portion including a phosphor on its one surface. Such a wavelength conversion portion including the phosphor on the glass plate preferably has a uniform thickness. For example, the phosphor may be printed on the glass plate. According to this wavelength conversion portion, the thickness of the phosphor can be substantially uniform. As a result, the optical path length of light that passes through the phosphor can be fixed. Therefore, color unevenness and a yellow ring phenomenon can be suppressed. Instead of printing, a phosphor sheet may be constructed by forming a phosphor into a sheet shape, and be applied onto a glass plate. The material of the glass plate can be selected from borosilicate glass and silica glass, for example.

The wavelength conversion portion that includes a phosphor in the wavelength conversion member 20 preferably has a thickness not smaller than 20 μm and not greater than 500 μm. If the wavelength conversion member 20 has a thickness greater than 500 μm, its heat dissipating performance is likely to decrease. From the viewpoint of heat dissipating performance, it is preferable that the thickness of the wavelength conversion member 20 is minimized. However, if the thickness is smaller than 20 μm, the expected chromaticity range of light is likely to be narrow.

The wavelength conversion portion that includes a phosphor in the wavelength conversion member 20 can be constructed of a single layer or multilayer. In the case in which two or more wavelength conversion layers formed of different phosphors, it is preferable that a first wavelength conversion layer including a red phosphor is arranged on the second surface 12 of the light emitting element 10, and a second wavelength conversion layer including a yellow phosphor is arranged on the first wavelength conversion layer. According to this arrangement, the light extracting efficiency of the light emitting device can be improved.

(Phosphor)

Any phosphor that can be excited by light emitted by the light emitting element 10 can be used. Examples of a phosphor that can be excited by a blue or ultraviolet light emitting element can be provided by yttrium aluminum garnet group phosphor activated by cerium; lutetium aluminum garnet group phosphor activated by cerium; silicate group phosphor activated by europium; β-SIALON phosphor, nitride group phosphor; fluoride group phosphor activated by manganese; sulfide group phosphor, quantum dot phosphor, and the like. Various colors of light emitting devices (for example, white light emitting device) can be produced by using these phosphors and a blue or ultraviolet light emitting element.

(Bonding Member 32)

The bonding member 32 is interposed between the light emitting element 10 and the wavelength conversion member 20, and bonds them to each other. The bonding member 32 can be formed of a transparent resin. The bonding member 32 has higher transmittance than the light reflection member 40 for light from the light emitting element 10. The bonding member 32 can be formed of a resin that can bond the first surface 21 of the wavelength conversion member 20 to the second surface 12 of the light emitting element, for example, dimethyl group resin, phenyl group resin, diphenyl group resin, or the like.

(Inclined Surface 31)

A part of the material of the bonding member 32 that is not cured will overflow from the interface between the first surface 21 of the wavelength conversion member 20 and the second surface 12 of the light emitting element, and reach the side surfaces of the light emitting element 10. That is, the bonding member 32 will be continuously formed to the side surfaces of the light emitting element 10 from the interface between the first surface 21 of the wavelength conversion member 20 and the second surface 12 of the light emitting element, and extend from a peripheral edge part 21b of the first surface 21 of the wavelength conversion member 20 to the first surface 11 of the light emitting element. As a result, as shown in the cross-sectional view of FIG. 6, an inclined surface 31 can be formed from the first surface 21 of the wavelength conversion member 20 to the first surface 11 of the light emitting element.

The peripheral edge part 21b of the first surface 21 of the wavelength conversion member 20, refers to the peripheral part of the first surface 21 (which faces the second surface 12) of the wavelength conversion member 20 that is arranged around the light emitting element. Because the wavelength conversion member 20 is slightly larger than the light emitting element 10, the first surface 21 of the wavelength conversion member 20 includes the peripheral edge part 21b that does not overlap the second surface 12 of the light emitting element as viewed in a plan view. For example, in the manufacturing processes of the light emitting device, when the light emitting element 10 and the wavelength conversion member 20 are bonded by an uncured material of the bonding member 32, the uncured material of the bonding member 32 overflows from the interface between the first surface 21 of the wavelength conversion member 20 and the second surface 12 of the light emitting element and is forcedly moved toward the peripheral edge part 21b of the first surface 21 of the wavelength conversion member 20. After that, the uncured material moves down along the side surfaces of the light emitting element 10. As a result, the inclined surface 31 is formed from the first surface 21 of the wavelength conversion member 20 to the first surface 11 of the light emitting element.

(Light Reflection Member 40)

The light reflection member 40 serves to cover the bonding member 32 and the wavelength conversion member 20. Suitable example of a resin material for forming the light reflection member 40 can be provided by light-transmissive resins such as silicone resin, dimethyl silicone resin, phenyl silicone resin, epoxy resin, and phenol resin, and the like. In order to efficiently reflect light emitted by the light emitting element 10, the light reflection member 40 is preferably formed of a resin with high reflectance. For example, the light reflection member can be formed a light-transmissive resin in which a light-reflecting substance is dispersed. Suitable examples of the light-reflecting substance can be provided by titanium oxide, silicon oxide, zirconium oxide, potassium titanate, aluminum oxide, aluminum nitride, boron nitride, mullite, and the like. Granular, fibrous, and strip-shaped light-reflecting substances can be used. In particular, fibrous substances are preferably used because they are expected to reduce the thermal expansion coefficient of the light reflection member. The light reflection member 40 has reflectance not smaller than 70% for the light emitted by the light emitting element 10. According to this, light that is incident on the light reflection member 40 can be reflected, and directed toward the second surface 22 of the wavelength conversion member 20. As a result, the light extracting efficiency of the light emitting device can be increased.

The light reflection member 40 is preferably in contact with the side surfaces of the wavelength conversion member 20 so as to cover the side surfaces. According to this arrangement, the light emitting device can have high contrast between the light emission area and non-light emission area. In addition, the light reflection member 40 is preferably arranged between the first surface 11 of the light emitting element and the supporting member 1. According to this arrangement, light emitted by the light emitting element 10 is reflected by the light reflection member 40 arranged between the first surface 11 of the light emitting element and the supporting member. As a result, absorption by the supporting member can be suppressed. It is preferable that the light reflection member 40 has an inclined part that is inclined from the peripheral edges of the wavelength conversion member 20 toward the peripheral edges of the light emitting element so that the thickness of the light reflection member 40 becomes thinner toward the peripheral edges of the light emitting element. According to this arrangement, in the case in which the light emitting device includes the sealing member 50 that covers the wavelength conversion member 20 and the light reflection member 40, the height of the lower surface of the sealing member 50 in the peripheral edges of the light emitting device can be low. Therefore, the light emitting device can be thin.

It is preferable that the upper surface of the light reflection member 40 is positioned higher than the upper surface of the wavelength conversion member 20. According to this arrangement, wavelength-converted light and light emitted by the light emitting element 10 can be effectively incident on and reflected by the interior surfaces of the wavelength conversion member 20.

(Sealing Member 50)

The sealing member 50 is arranged on the upper surface of the wavelength conversion member 20, as shown in FIGS. 2, 6, etc. The sealing member 50 includes the hemispherical lens portion 51 and the flange portion 52. The hemispherical lens portion 51 has a circular shape as viewed in a plan view and a semicircular shape as viewed in a cross-sectional view. The flange portion 52 protrudes from the outer periphery of the lens portion 51. The sealing member 50 can be formed of a transparent sealing material. Light-transmissive resins, glass, or the like can be used for the sealing member 50. In particular, light-transmissive resins are preferably used. Examples of the light-transmissive resins can be provided by thermosetting resins (e.g., silicone resin, epoxy resin, and phenol resin), and thermoplastic resins (e.g., polycarbonate resin and acrylate resin). In particular, a silicone resin that has good light resistance and heat resistance is preferably used. Various kinds of fillers may be included in the sealing member 50 for purpose of viscosity adjustment and the like.

Figure 11:
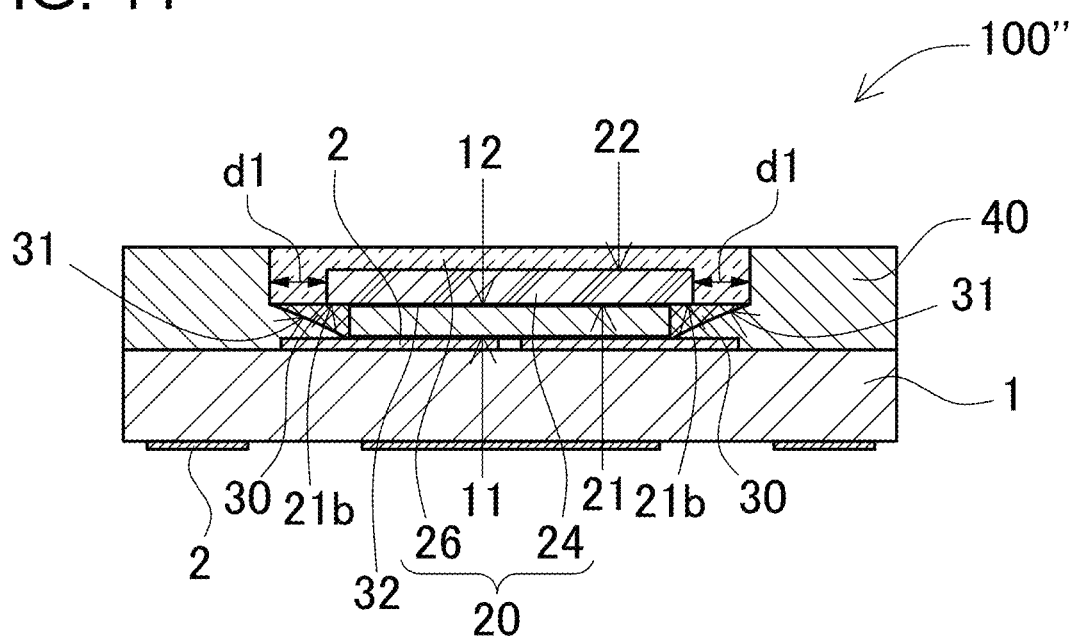
FIG. 11 is a plan view showing a light emitting device according to another modified embodiment.

However, the sealing member is not essential. A light emitting device 400 according to modified embodiment shown in FIG. 11 does not include the sealing member. For example, such a light emitting device is suitably used for non-light-gathering devices (which do not need a lens portion) or the like.

In addition, the light emitting device 100 can include a protection element that protects the light emitting element 10 from damage caused by overcurrent. The protection element can be embedded in the light reflection member 40. Examples of the protection element can be provided by Zener diode, capacitor, and the like. The protection element preferably includes electrodes on its one surface, because it can be mounted in a facedown manner without wire.

Second Embodiment

Figure 12:
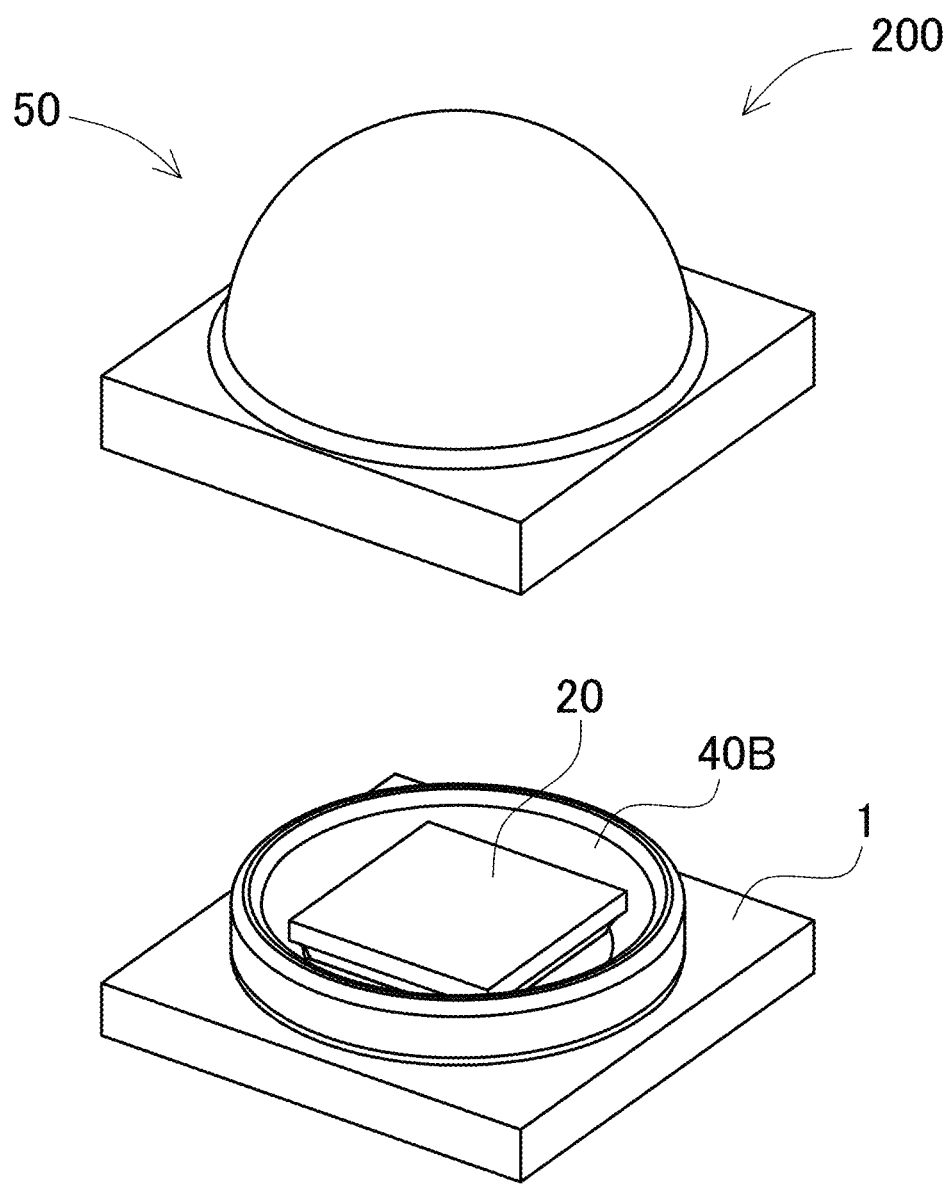
FIG. 12 is a perspective view showing a light emitting device according to a second embodiment with its sealing member being removed.
Figure 13:
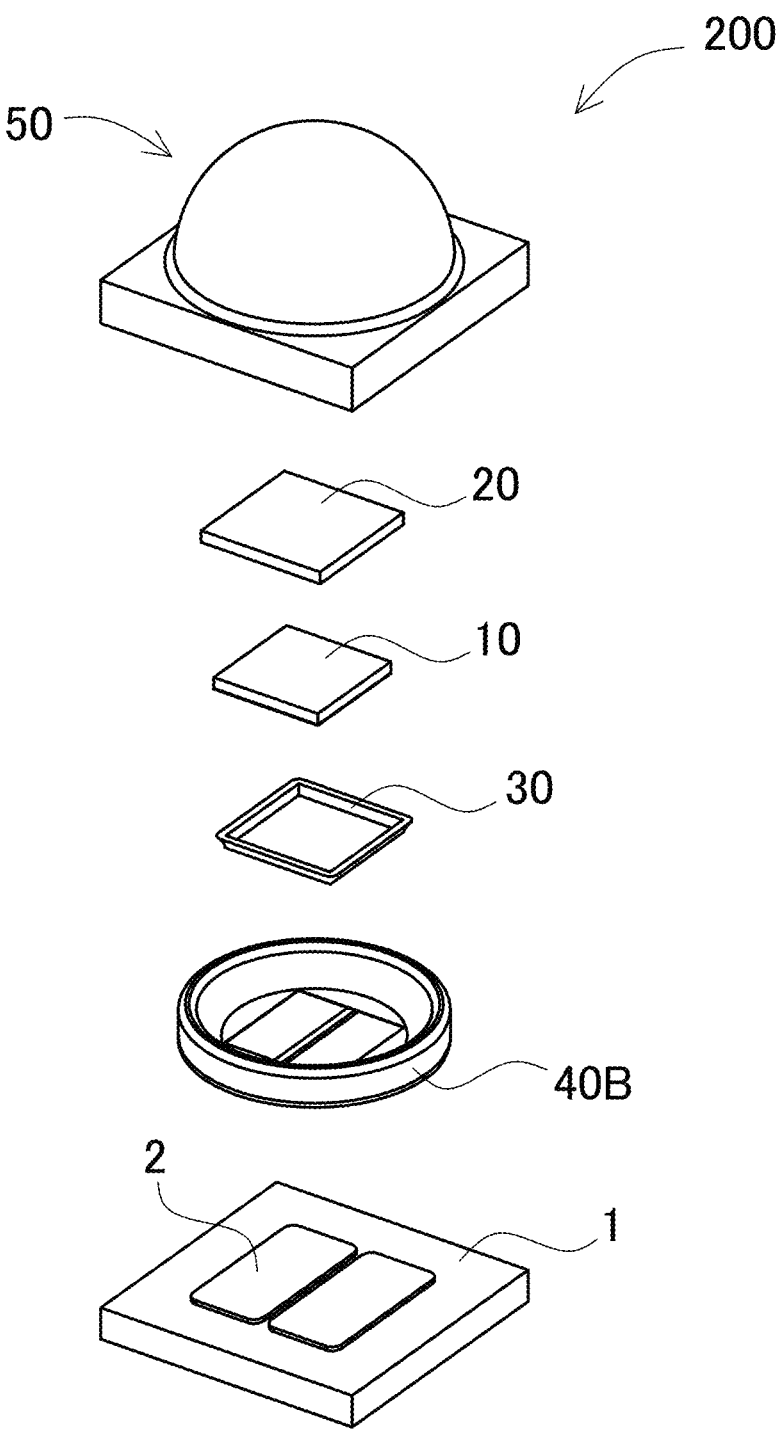
FIG. 13 is an exploded perspective view showing the light emitting device shown in FIG. 12.
Figure 14:
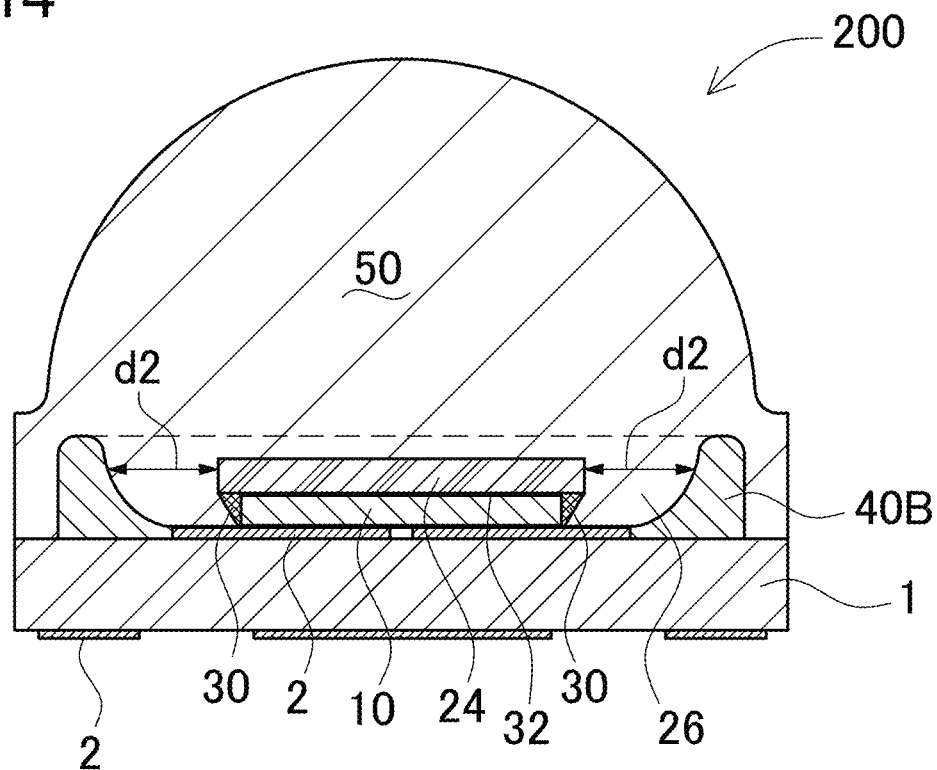
FIG. 14 is a cross-sectional view showing the light emitting device according to the second embodiment.

The light reflection member 40 according to the foregoing first embodiment has been illustratively described to have a box shape having flat interior vertical walls as shown in FIG. 4, etc. Also, the light reflection member 40 according to the first embodiment has been illustratively described to have the inclined surfaces under the interior vertical walls as shown in the cross-sectional view of FIG. 6. It is noted that the light reflection member according to the present invention is not limited to this. The light reflection member may have a straight-line or intersecting-straight-line shape, or the like as viewed in a cross-section. Alternatively, the light reflection member may have a curved-line shape as viewed in a cross-section. This type of light emitting device 200 according to a second embodiment is now described with reference to FIGS. 12 to 14. FIG. 12 is a perspective view showing the light emitting device 200 according to the second embodiment with its sealing member being removed. FIG. 13 is an exploded perspective view showing the light emitting device 200 shown in FIG. 12. FIG. 14 is a cross-sectional view showing the light emitting device 200 according to the second embodiment. The illustrated light emitting devices 200 includes a light reflection member 40B that has a concave shape. Light emitted by the light emitting element 10 is reflected at continuously varying angles by the curved inclined surface of the light reflection member 40B shown in the cross-sectional view of FIG. 14. As a result, it is possible to reduce luminance unevenness caused by reflected light gathering a certain direction. Although the light reflection member shown in FIG. 4 has a rectangular box shape, the light reflection member shown in FIGS. 12 and 13 has a cylindrical shape. According to this arrangement, reflected light can be prevented from gathering in the corners defined by the neighboring sides of the rectangular shape. As a result, luminance unevenness can be reduced in a plan view as compared with the rectangular box shape.

The gap d2 between the end surface of the wavelength conversion portion 24 and the interior wall of the light reflection member 40B according to the embodiment shown in FIG. 14 is dimensioned larger as compared with the gap d1 between the end surface of the light emitting element 10 and the interior vertical wall of the light reflection member 40 according to the embodiment shown in FIG. 6. The gap d2 can increase non-converted light (emitted by the light emitting element 10 and not converted by the wavelength conversion portion 24) that exits from the light emitting device. As a result, light distribution color unevenness can be further improved.

(Light-Transmissive Portion 26)

The light-transmissive portion 26 is formed at least around the wavelength conversion member 20. Because the light-transmissive portion 26 is arranged around the wavelength conversion portion 24, light emitted by the light emitting element 10 can pass through the light-transmissive portion 26 without converted by the wavelength conversion portion 24. That is, the component of light emitted by the light emitting element 10 can be relatively increased around the wavelength conversion portion 24. If the light emitting device according to the embodiment shown in FIG. 7 is considered as a light emitting device that includes a blue LED as the light emitting element 10 and a yellow phosphor (e.g., YAG) as the wavelength conversion portion 24, and can emit white light by mixing blue light and yellow light, although white light can be obtained near the central part of the wavelength conversion portion 24, the amount of yellow light component tends to increase toward the periphery of the wavelength conversion portion 24 relative to blue light component in light emitted from the light emitting device. The reason is that the optical path length of the light reflected or scattered by the wavelength conversion portion 24 becomes longer toward the central part. For this reason, blue light that is not converted in wavelength is led to pass by the side surfaces of the wavelength conversion portion 24 so that the chromaticity is adjusted. As a result, such light distribution color unevenness can be reduced.

In although the light-transmissive portion 26 is preferably arranged around the wavelength conversion member 20, the light-transmissive portion is allowed to be partially absent as long as light distribution color unevenness is acceptable. The light-transmissive portion may be arranged near the corners of a rectangular light emitting element where light distribution color unevenness is likely occur, while the light-transmissive portion may be absent in the rest parts around the rectangular light emitting element, for example.

Figure 15:
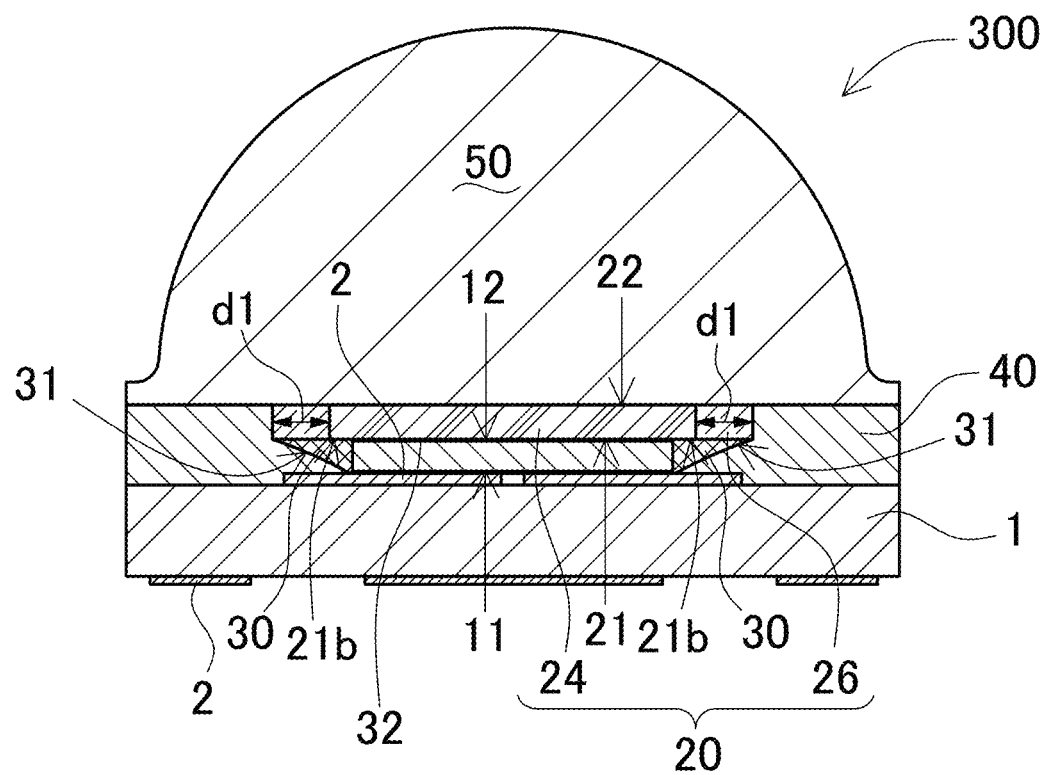
FIG. 15 is a cross-sectional view showing a light emitting device according to a third embodiment.

The light-transmissive portion 26 is arranged not only around the wavelength conversion portion 24 but also on the upper surface of the wavelength conversion portion 24 so as to continuously cover the wavelength conversion portion 24 in the embodiment shown in FIG. 6, etc. This arrangement has an advantage in terms of the manufacturing process that the light-transmissive portion 26 can be easily formed around the wavelength conversion portion 24. However, even if the light-transmissive portion 26 is not formed on the upper surface of the wavelength conversion portion 24, the light distribution color unevenness reduction effect can be still provided. For this reason, the light-transmissive portion on the upper-surface side may be omitted. For example, the light-transmissive portion on the upper-surface side can be removed by grinding or the like after the light-transmissive portion is formed. This type of light emitting device to a third embodiment is now described with reference FIG. 15. In this embodiment, the upper surface of the wavelength conversion portion 24 is covered not by the light-transmissive portion 26 but by the sealing member 50 so that the sealing member 50 protects the surface of the wavelength conversion portion 24.

The light-transmissive portion 26 included in the wavelength conversion member 20 may be integrally formed with the sealing member 50. Although the space between the side surface of the light emitting element 10 and the inclined surfaces of the light reflection member 40 is filled with the light-transmissive member 30 in the first embodiment as shown in the cross-sectional view of FIG. 6, the present invention is not limited to this. That is, the light-transmissive member 30 may have a roughly inverted triangular shape that extends from the side surfaces of the light emitting element 10 to the back-surface side of the wavelength conversion portion 24, and the light-transmissive portion 26 may extend to the side surfaces of this light-transmissive member 30 as shown in the cross-sectional view of FIG. 14. It should be noted that FIG. 14 shows an exemplary configuration in which the light-transmissive portion 26 is integrally formed with the sealing member 50. According to this arrangement, the interface between the light-transmissive member 30 and the light-transmissive portion 26 shown in FIG. 14 is inclined, that is, extends in a slanting direction from the lower end of the wavelength conversion portion 24 so that the light-transmissive portion 26 catches the light-transmissive member 30. As a result, the connection strength between the light-transmissive portion 26 and the light-transmissive member 30 can be improved as compared with the embodiment shown in the cross-sectional view of FIG. 6 where the interface between the light-transmissive member 30 and the light-transmissive portion 26 lies in a horizontal plane. It is noted that the gap d2 between the wavelength conversion portion 24 and the light reflection member 40B is not necessarily filled with the light-transmissive portion 26 or the like. The gap d2 may be partially or entirely remain hollow. In this case, the luminous flux of the light emitting device can be improved.

(Manufacturing Method of Light Emitting Device 100 of First Embodiment)

Figure 16:
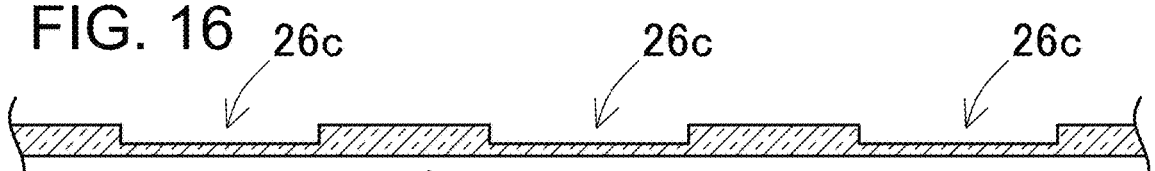
FIG. 16 is a cross-sectional view showing one process of a method for manufacturing the light emitting device according to the first embodiment.

A method for manufacturing the light emitting device 100 according to the first embodiment is now described with reference to FIGS. 16 to 20. The wavelength conversion member 20 that includes the wavelength conversion portion 24 that includes a phosphor is prepared, and the light-transmissive portion 26 that is arranged around the wavelength conversion portion 24. For example, a light-transmissive portion material 26b that has a plurality of recessed parts 26c spaced away from each other, as shown in FIG. 16, is prepared. The light-transmissive portion material 26b is a material from which the light-transmissive portions 26 can be obtained. A material sheet made of a light-transmissive resin (e.g., a sheet of silicone resin) can be used as the light-transmissive portion material 26b, for example. The light-transmissive portion material 26b is not limited to a material sheet of resin. A glass sheet may be used. The recessed parts 26c can have a circular, elliptical, or rectangular shape as viewed in a plan view.

Figure 17:
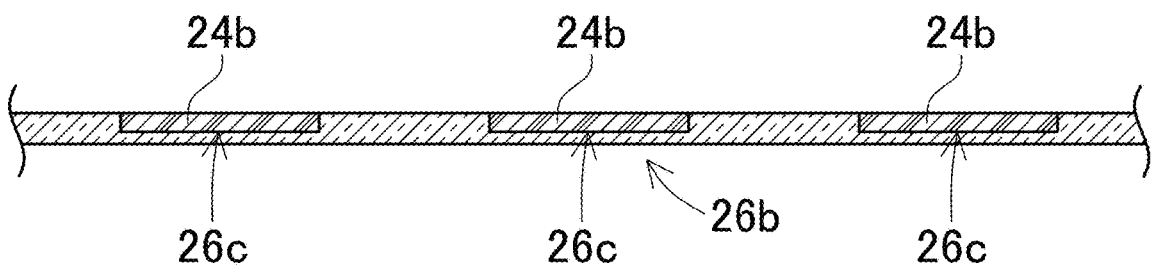
FIG. 17 is a cross-sectional view showing another process of the method for manufacturing the light emitting device according to the first embodiment.
Figure 18:
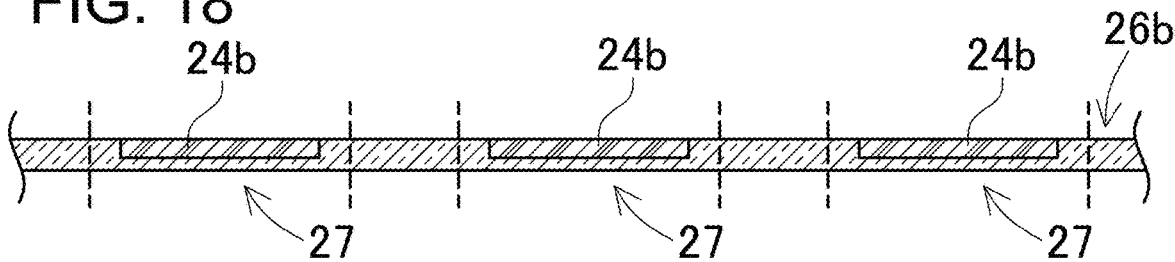
FIG. 18 is a cross-sectional view showing another process of the method for manufacturing the light emitting device according to the first embodiment.

Subsequently, the recessed parts 26c are filled with resin 24b that includes a phosphor (phosphor-containing resin material 24b) for forming the wavelength conversion portion 24 as shown in FIG. 17. The sheet of silicone resin is divided into blocks as shown in FIG. 18. Thus, individual blocks 27 for the wavelength conversion member 20 are obtained.

Figure 19:
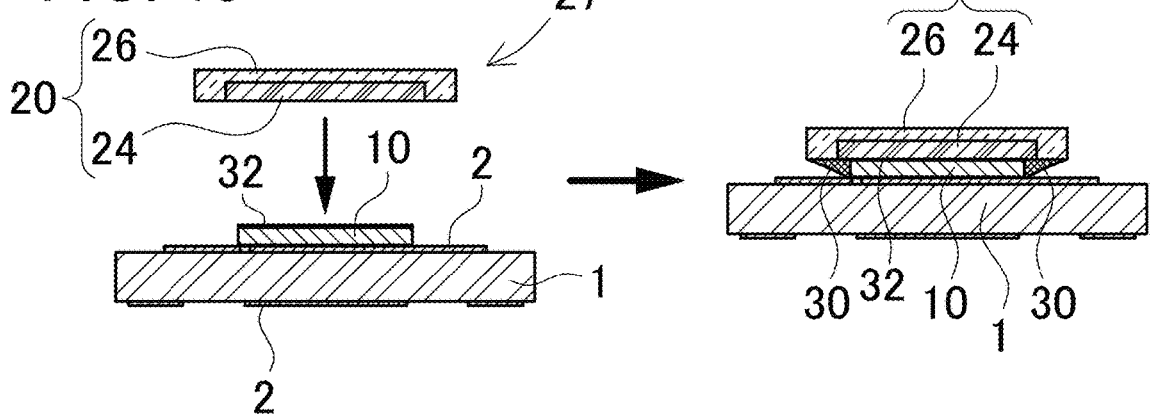
FIG. 19 is a cross-sectional view showing another process of the method for manufacturing the light emitting device according to the first embodiment.

Subsequently, the wavelength conversion member 20 is arranged on the light emitting element 10 that is arranged on the support member 1 that is previously prepared. The light emitting element 10 is mounted in a flip-chip mounting manner on the support member 1. The light emitting element 10 is formed smaller than the wavelength conversion member 20 as viewed in a plan view. The individual block 27 is turned upside down so that the phosphor (i.e., the wavelength conversion portion 24) is located on the lower-surface side, and the wavelength conversion member 20 is placed on the upper surface of this support member 1, as shown in FIG. 19. After this placement, the light-transmissive member 30 is arranged on the support member 1 so as to cover a part of light-transmissive portion 26 and the side surfaces of the light emitting element 10. To this end, a light-transmissive bonding material is applied to a surface that will be the interface between the upper surface of the light emitting element 10 and the wavelength conversion portion 24. After that, when the wavelength conversion portion 24 is placed on the upper surface of the light emitting element 10, the bonding material will overflow from the interface and be forcedly moved from the side surfaces of the light emitting element 10 toward the peripheral part of the wavelength conversion member 2. The bonding material adheres to the part from the side surfaces of the light emitting element 10 to the peripheral part of the wavelength conversion member 2, and is cured into a fillet shape. A material similar to the sealing member 50 (e.g., silicone resin or epoxy resin) can be suitably used for the light-transmissive bonding material. The light-transmissive member 30 can be formed of a part of the bonding material that overflows from the interface. Alternatively, a light-transmissive material can be additionally provided as the light-transmissive member 30 between the side surfaces of the light emitting element 10 and the light reflection member 40.

Figure 20:
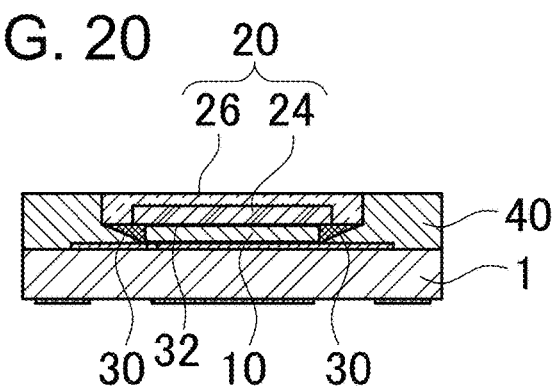
FIG. 20 is a cross-sectional view showing still another process of the method for manufacturing the light emitting device according to the first embodiment.

In addition, the light reflection member 40 is arranged on the support member 1. In this embodiment, as shown in FIG. 20, white resin is formed on the peripheral part of the upper surface of the support member 1 so as to cover the side surfaces of the wavelength conversion member 20 and the light-transmissive member 30.

Finally, the sealing member 50 is placed on the upper surfaces of the wavelength conversion member 20 and the light reflection member 40. The light emitting device 100 shown in the cross-sectional view of FIG. 6 can be manufactured by these processes.

(Manufacturing Method of Light Emitting Device 300 of Third Embodiment)

Figure 21:
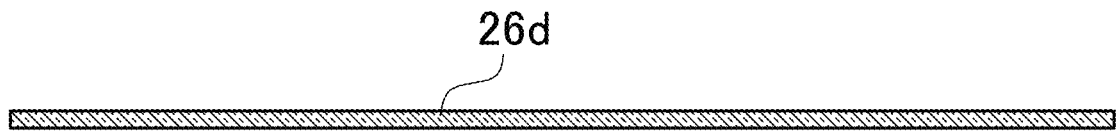
FIG. 21 is a cross-sectional view showing one process of a method for manufacturing the light emitting device according to the third embodiment.

A method for manufacturing a light emitting device 300 according to the third embodiment is now illustratively described with reference to FIGS. 21 to 30. A light-transmissive portion material 26d shown in FIG. 21 is first prepared. Similar to the light-transmissive portion material 26b, the light-transmissive portion material 26d is a material from which the light-transmissive portions 26 can be obtained. A material sheet made of a light-transmissive resin (e.g., a sheet of silicone resin) can be used as the light-transmissive portion material 26d, for example.

Figure 22:
FIG. 22 is a cross-sectional view showing another process of the method for manufacturing the light emitting device according to the third embodiment.
Figure 23:
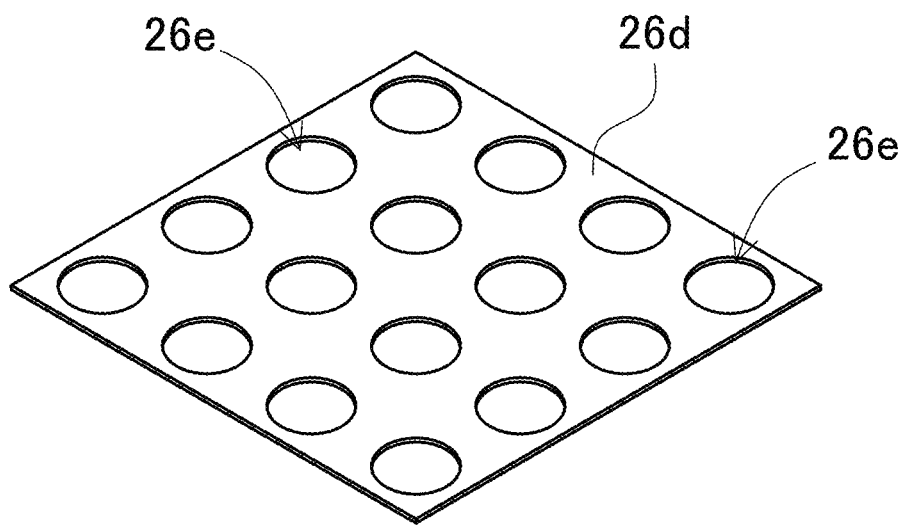
FIG. 23 is a perspective view showing a light-transmissive resin material sheet with openings being formed.

Subsequently, openings 26e are formed in the light-transmissive portion material 26d as shown in FIG. 22. The openings 26e have a predetermined size and are spaced away at a fixed interval from each other in the sheet-shaped light-transmissive portion material 26d. The openings 26e can have a shape selected from circular, elliptical, rectangular and polygonal shapes, and the like. In this embodiment, the openings 26e have a circular shape as shown in a perspective view of FIG. 23. For example, the openings 26e are formed by punching or the like.

Figure 24:
FIG. 24 is a cross-sectional view showing another process of the method for manufacturing the light emitting device according to the third embodiment.

Subsequently, each opening 26e in the light-transmissive portion material 26d accommodates the wavelength conversion portion 24 as shown in FIG. 24. In this embodiment, each opening 26e is filled with a resin material 24c that includes a phosphor (phosphor-containing resin material 24c). The wavelength conversion portion 24 is formed by curing the resin material 24c. The process for filling the opening 26e with the phosphor-containing resin material 24c can be selected from application by printing, potting, spraying, and the like.

Figure 25:
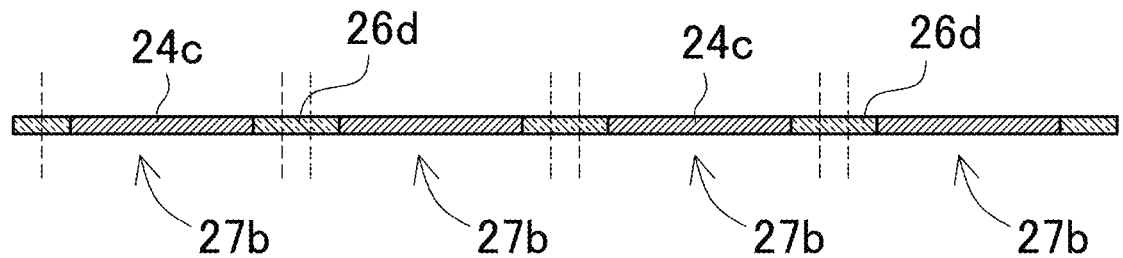
FIG. 25 is a cross-sectional view showing another process of the method for manufacturing the light emitting device according to the third embodiment.
Figure 26:
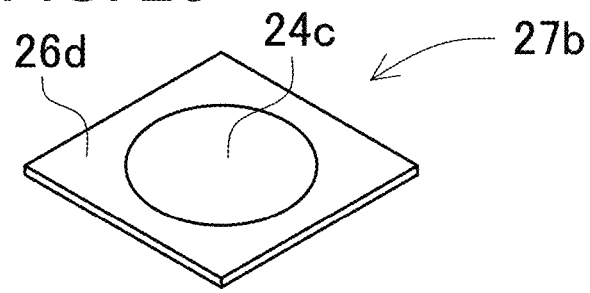
FIG. 26 is a cross-sectional view showing another process of the method for manufacturing the light emitting device according to the third embodiment.

After curing the phosphor-containing resin material 24c, as shown in FIG. 25, the light-transmissive portion material 26d is divided into blocks with a predetermined size. Dicing or the like can be used for the division process. The blocks 27b obtained by the division can have any shape such as rectangular or polygonal shape, or the like. In this embodiment, the blocks 27b have a square shape as shown in a perspective view of FIG. 26. Each block 27b includes the phosphor-containing resin material 24c after the division process by cutting. Although each block 27b includes one phosphor-containing resin material 24c part after the cutting in this embodiment, each block may include two or more phosphor-containing resin material 24c parts after the cutting. Each block 27b obtained as discussed above forms the wavelength conversion member 20 that includes the light-transmissive portion 26 arranged around the wavelength conversion portion 24.

Figure 27:
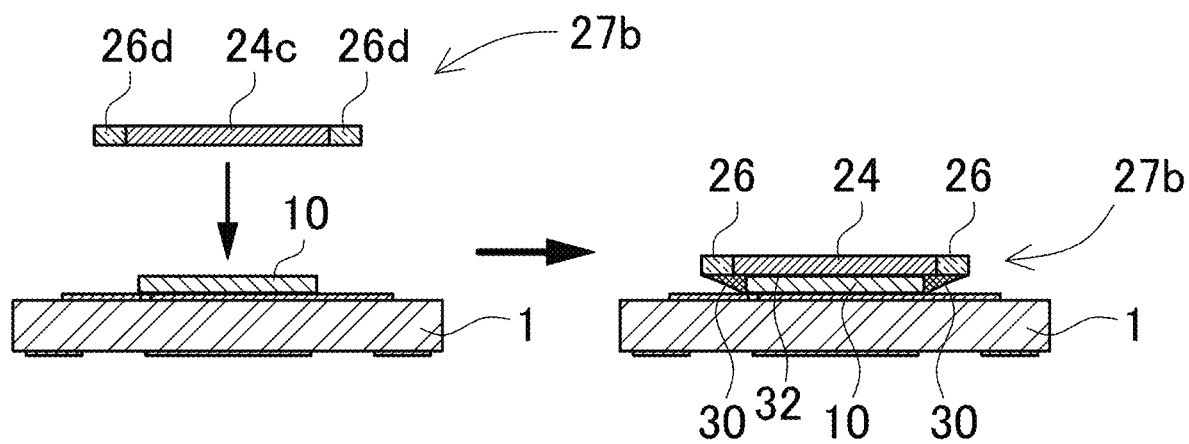
FIG. 27 is a cross-sectional view showing another process of the method for manufacturing the light emitting device according to the third embodiment.

Subsequently, each block 27b is bonded onto the light emitting element 10. In this embodiment, the light emitting element 10 is previously mounted on the support member 1 as shown in FIG. 27. In this embodiment, the light emitting element 10 is mounted in a flip-chip mounting manner on the support member 1. Also, the light emitting element 10 is preferably smaller than the wavelength conversion member 20 as viewed in a plan view. Each block 27b is bonded to the upper surface of the support member 1 by using a light-transmissive bonding material. The light-transmissive bonding material is applied to one of or both of the upper surface of the light emitting element 10 and the lower surface of the block 27b between which the interface is formed. After that, when the block 27b is placed on the upper surface of the light emitting element 10, the bonding material will overflow from the interface of the light emitting element 10 and spread around the light emitting element 10. The overflowing bonding material extends from the side surfaces of the light emitting element 10 to the peripheral part of the lower surface of the block 27b. As a result, the bonding material is formed into a fillet shape the cross-sectional configuration of which is roughly inverted triangular as shown in FIG. 27. The light-transmissive member 30 is formed by curing the light-transmissive bonding material. A material similar to the sealing member 50 (e.g., silicone resin, epoxy resin, etc.) can be suitably used for the light-transmissive bonding material as discussed above.

Figure 28:
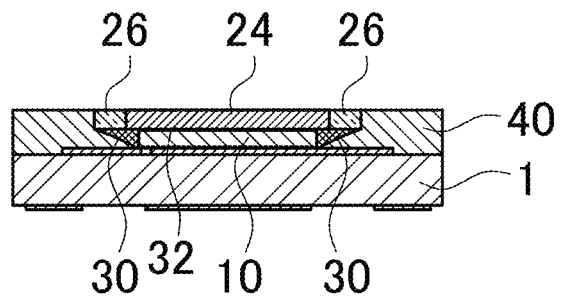
FIG. 28 is a cross-sectional view showing another process of the method for manufacturing the light emitting device according to the third embodiment.

In addition, the light reflection member 40 is arranged on the support member 1. In this embodiment, as shown in FIG. 28, a white resin material that includes a filler material is placed on the upper surface of the support member 1 so as to cover the side surfaces of the wavelength conversion member 20 and the light-transmissive member 30. The light reflection member 40 is formed by curing the white resin material.

Figure 29:
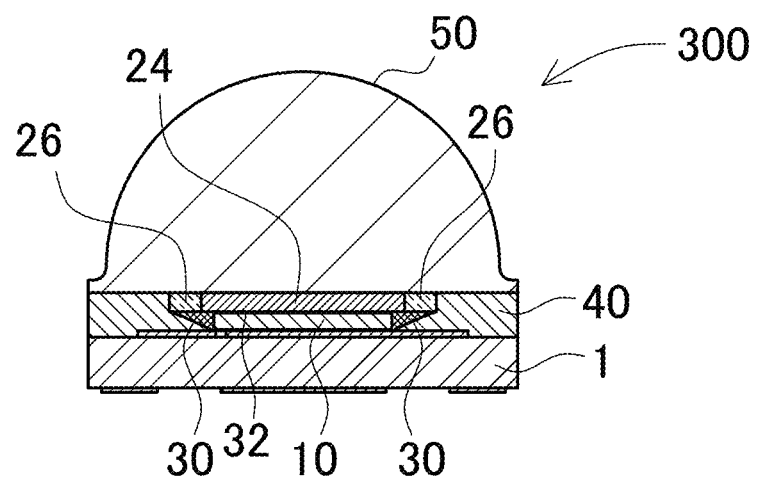
FIG. 29 is a cross-sectional view showing still another process of the method for manufacturing the light emitting device according to the third embodiment.
Figure 30:
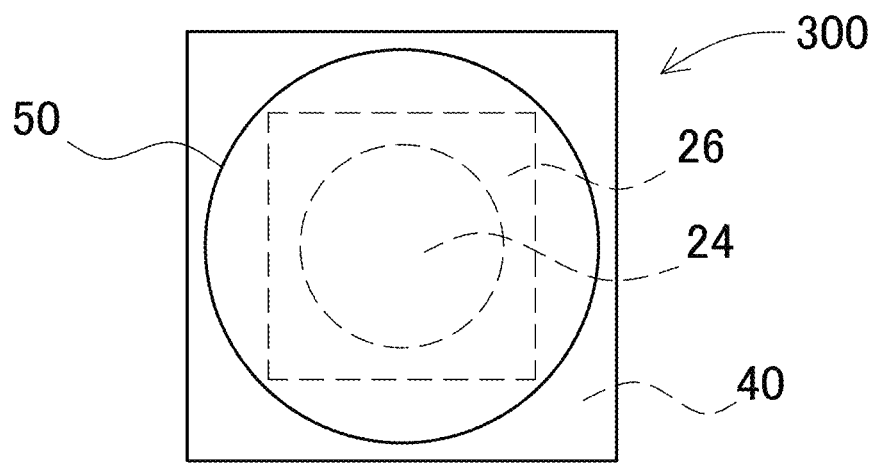
FIG. 30 is a plan view showing the light emitting device according to the third embodiment.

Finally, the sealing member 50 is placed on the upper surfaces of the wavelength conversion member 20 and the light reflection member 40 as shown in FIG. 29. The light emitting device 300 shown in a pain view of FIG. 30 can be manufactured by these processes.

(Manufacturing Method of Light Emitting Device 400 of Fourth Embodiment)

Figure 31:
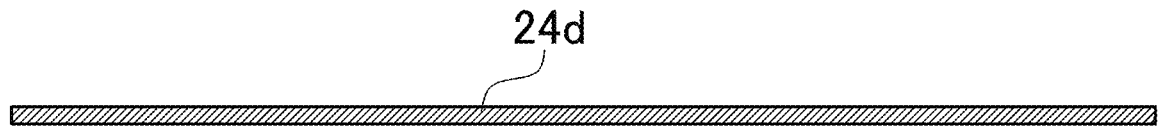
FIG. 31 is a cross-sectional view showing one process of a method for manufacturing a light emitting device according to a fourth embodiment.

It has been illustratively described that the light-transmissive resin material sheet that will form the light-transmissive portion 26 is previously prepared and provided with openings, and the openings are filled with the phosphor-containing resin material 24c and will form the wavelength conversion portion 24 in the method for manufacturing a light emitting device according to the third embodiment. However, a method for manufacturing a light emitting device according to the present invention is not limited to this. The wavelength conversion portion can be previously prepared, and the light-transmissive portion can be formed around the wavelength conversion portion. This type of method for manufacturing a light emitting device 400 according to a fourth embodiment is now described with reference to FIGS. 31 to 40. A resin material sheet 24d that includes a phosphor (phosphor-containing resin material sheet 24d) is first prepared as shown in FIG. 31. For example, a sheet made of silicone resin that includes a distributed phosphor is produced as the resin material sheet 24d.

Figure 32:
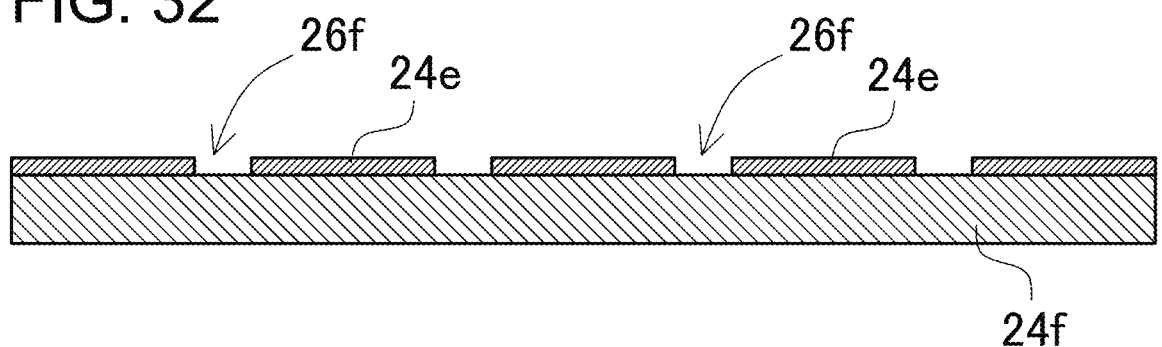
FIG. 32 is a cross-sectional view showing another process of the method for manufacturing the light emitting device according to the fourth embodiment.
Figure 33:
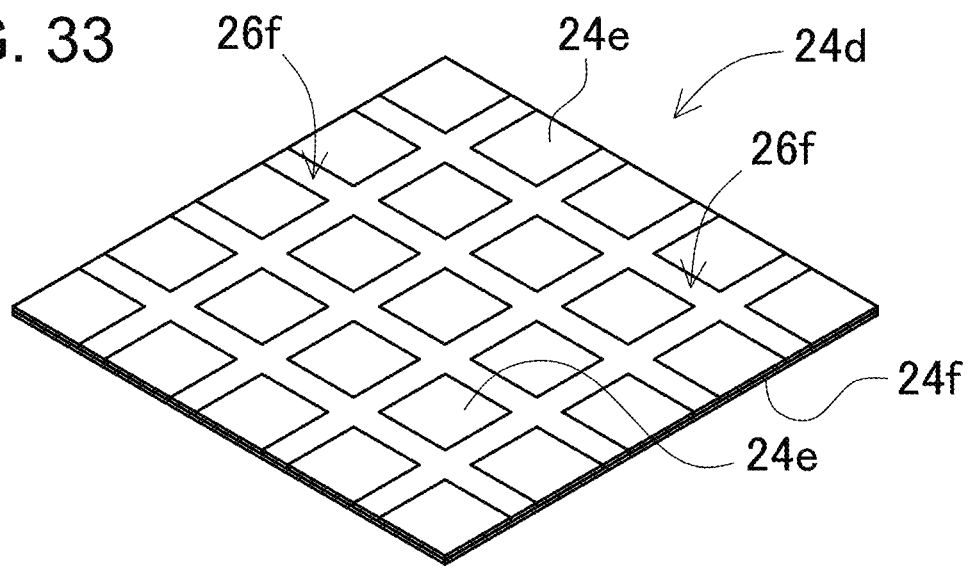
FIG. 33 is a perspective view showing a phosphor-containing resin material sheet that has grooves formed on its surface.

Subsequently, grooves 26f are formed in the phosphor-containing resin material sheet 24d as shown in FIG. 32. In this embodiment, after the phosphor-containing resin material sheet 24d is arranged on a supporting substrate 24f, the grooves 26f are formed in the resin material sheet 24d. The phosphor-containing resin material sheet 24d is divided based on a predetermined pattern along the grooves 26f. In the embodiment shown in a perspective view of FIG. 33, the grooves 26f are formed on a sheet made of silicone that includes a distributed phosphor to form a grid pattern. The sheet is divided into rectangular phosphor blocks 24e. Dicing can be used to form the grooves 26f, for example. To hold the phosphor blocks 24e obtained by the division, the resin material sheet 24d is preferably placed on the supporting substrate 24f, or on another sheet that serves as a jig or rest.

Figure 34:
FIG. 34 is a cross-sectional view showing another process of the method for manufacturing the light emitting device according to the fourth embodiment.

Subsequently, the light-transmissive portions 26 are formed around the phosphor blocks 24e, as shown in FIG. 34. For example, the grooves 26f are filled with light-transmissive silicone resin. Subsequently, the light-transmissive portions 26 are formed around the phosphor blocks 24e by curing the light-transmissive silicone resin.

Figure 35:
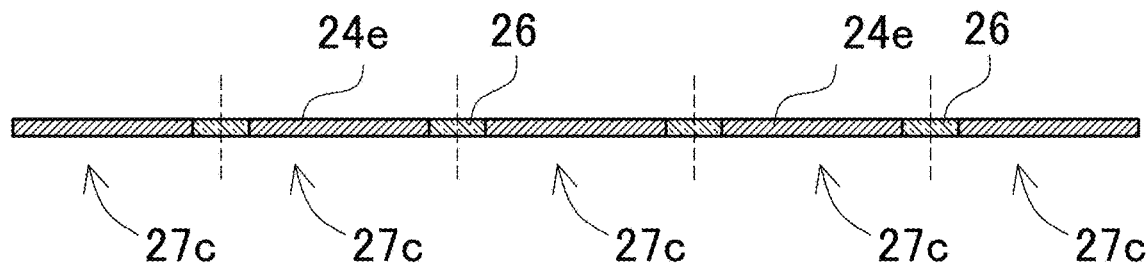
FIG. 35 is a cross-sectional view showing another process of the method for manufacturing the light emitting device according to the fourth embodiment.
Figure 36:
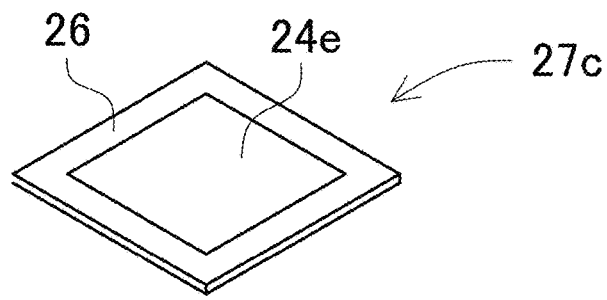
FIG. 36 is a cross-sectional view showing another process of the method for manufacturing the light emitting device according to the fourth embodiment.

Subsequently, the resin material sheet 24d that includes the light-transmissive portions 26 is divided into blocks having a predetermined size, as shown in FIG. 35. Each block 27c can have any shape such as rectangular or polygonal shape, or the like. In this embodiment, the blocks 27c have a square shape as shown in a perspective view of FIG. 36. The resin material sheet is divided by cutting so that the block 27c includes the phosphor block 24e. Although each block 27c includes one phosphor block 24e after the cutting in this embodiment, each block may include two or more phosphor blocks after the cutting as stated in the foregoing embodiment. Each block 27c obtained as discussed above forms the wavelength conversion member 20 that includes the light-transmissive portion 26 arranged around the wavelength conversion portion 24.

Figure 37:
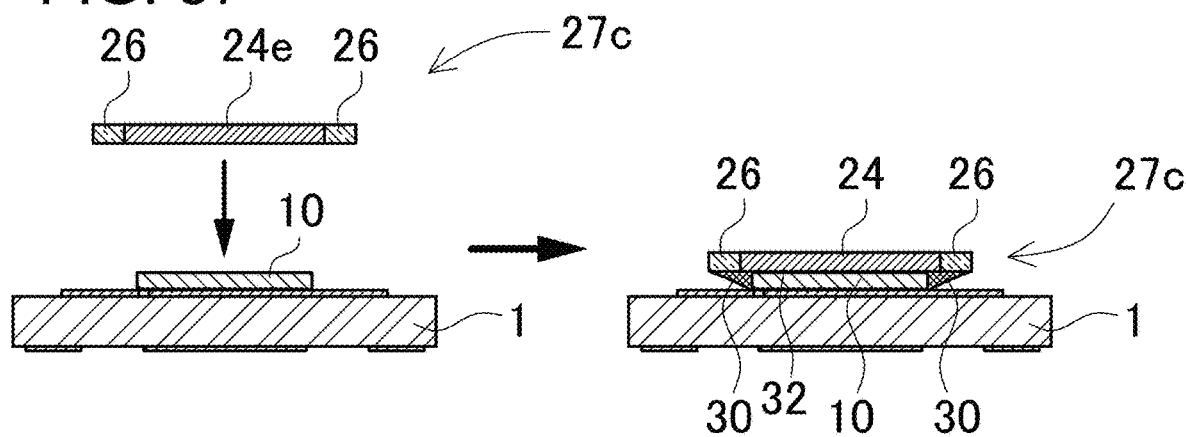
FIG. 37 is a cross-sectional view showing another process of the method for manufacturing the light emitting device according to the fourth embodiment.

Subsequently, each block 27c is similarly bonded onto the light emitting element 10. Also, in this embodiment, the light emitting element 10 is previously mounted on the support member 1 as shown in FIG. 37. Each block 27c is bonded to the upper surface of the support member 1 by using a light-transmissive bonding material. The bonding material will overflow from the boundary of the light emitting element 10 and spread around the light emitting element 10. The overflowing bonding material extends from the side surfaces of the light emitting element 10 to the peripheral part of the lower surface of the block 27c. As a result, the bonding material is formed into a fillet shape. The light-transmissive member 30 is formed by curing the light-transmissive bonding material.

Figure 38:
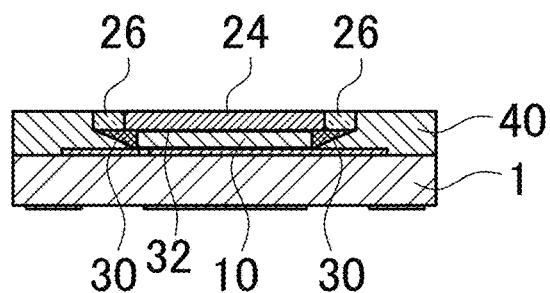
FIG. 38 is a cross-sectional view showing another process of the method for manufacturing the light emitting device according to the fourth embodiment.
Figure 39:
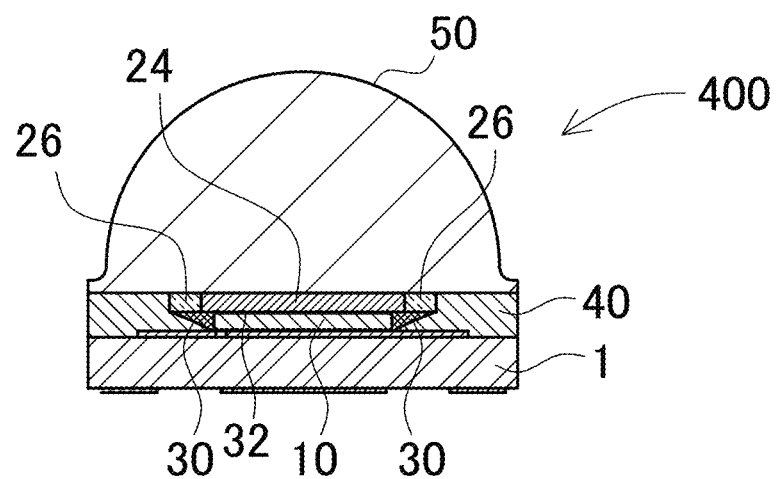
FIG. 39 is a cross-sectional view showing still another process of the method for manufacturing the light emitting device according to the fourth embodiment.
Figure 40:
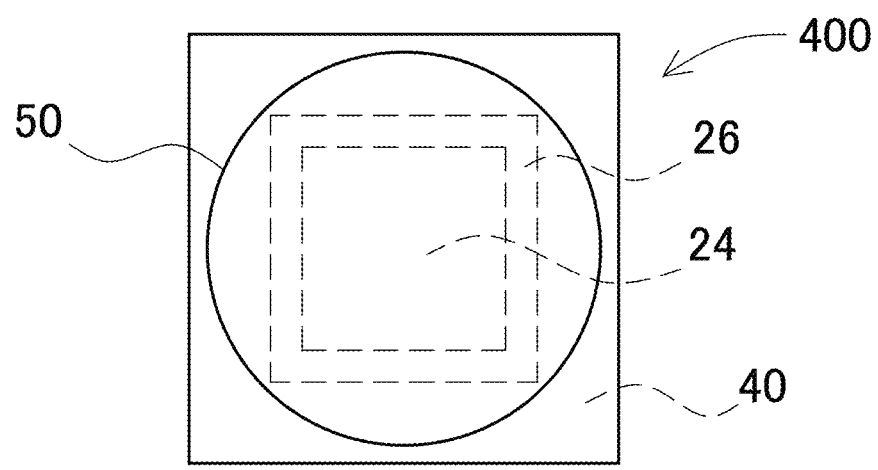
FIG. 40 is a plan view showing the light emitting device according to the fourth embodiment.

Subsequently, the light reflection member 40 is arranged on the support member 1 as shown in FIG. 38. Finally, the sealing member 50 is arranged on the upper surfaces of the wavelength conversion member 20 and the light reflection member 40 as shown in FIG. 39. The light emitting device 400 shown in a plan view of FIG. 40 can be manufactured by these processes.

A light emitting device according to the embodiments of the present invention can be suitably used for LED display, backlight for liquid crystal displays or the like, light source for lighting fixtures, headlight, signal light, illuminated switch, various types of sensors and indicators, and the like.

It should be apparent to those with an ordinary skill in the art that while various preferred embodiments of the invention have been shown and described, the invention is not limited to the particular embodiments disclosed, which are deemed to be merely illustrative of the inventive concepts, and which are suitable for all modifications and changes falling within the scope of the invention as defined in the appended claims.

What is claimed is:

1. A light emitting device comprising:
a light emitting element having an upper surface, a lower surface that is opposite to the upper surface, and one or more lateral surfaces;
a wavelength conversion member having an upper surface, a lower surface, and one or more lateral surfaces, the wavelength conversion member comprising:
a wavelength conversion portion that has an upper surface, a lower surface, and one or more lateral surfaces, wherein the wavelength conversion portion is arranged on or above the upper surface of the light emitting element, and
a light-transmissive portion that has an upper surface, a lower surface, and one or more lateral surfaces, wherein, in a plan view, the light-transmissive portion surrounds at least the one or more lateral surfaces of the wavelength conversion portion;
a sealing member comprising a lens portion that is arranged on or above the upper surface of the wavelength conversion member; and
a light reflection member that surrounds the one or more lateral surfaces of the wavelength conversion member;
wherein, in a plan view, the wavelength conversion member is inside a perimeter of the lens portion;
wherein the wavelength conversion portion comprises a phosphor; and
wherein the light-transmissive portion comprises a transparent glass plate having one surface facing the wavelength conversion portion.

2. The light emitting device according to claim 1,
wherein, in a plan view, the light emitting element is within a perimeter of the wavelength conversion portion.

3. The light emitting device according to claim 1,
wherein, in a plan view, at least a portion of the light reflection member is positioned between the wavelength conversion member and a periphery of the lens portion annularly.

4. The light emitting device according to claim 1,
wherein the one or more lateral surfaces of the light-transmissive portion form the one or more lateral surfaces of the wavelength conversion member.

5. The light emitting device according to claim 1,
wherein a thickness of the light reflection member at a periphery of the light emitting element is less than a thickness of the light reflection member at a periphery of the wavelength conversion member.

6. The light emitting device according to claim 5,
wherein the light reflection member has an inclined part that is inclined from the periphery of the wavelength conversion member toward the periphery of the light emitting element.

7. The light emitting device according to claim 1,
wherein the sealing member comprises a flange portion protruding outward from a periphery of the lens portion.

8. The light emitting device according to claim 1,
wherein the upper surface of the wavelength conversion portion and the upper surface of the light-transmissive portion form the upper surface of the wavelength conversion member.

9. The light emitting device according to claim 1, further comprising:
a light-transmissive member that is arranged between the light reflection member and the one or more lateral surfaces of the light emitting element;
wherein the light-transmissive member contacts a part of a lower surface of the light-transmissive portion of the wavelength conversion member.

10. The light emitting device according to claim 9,
wherein the light-transmissive member contacts the one or more lateral surfaces of the light emitting element.

11. A light emitting device comprising:
a light emitting element having an upper surface, a lower surface that is opposite to the upper surface, and one or more lateral surfaces;
a wavelength conversion member having an upper surface, a lower surface, and one or more lateral surfaces, the wavelength conversion member comprising:
a wavelength conversion portion that has an upper surface, a lower surface, and one or more lateral surfaces, wherein the wavelength conversion portion is arranged on or above the upper surface of the light emitting element, and
a light-transmissive portion that has an upper surface, a lower surface, and one or more lateral surfaces, wherein, in a plan view, the light-transmissive portion surrounds at least the one or more lateral surfaces of the wavelength conversion portion;
a sealing member comprising a lens portion that is arranged on or above the upper surface of the wavelength conversion member;
a light reflection member that surrounds the one or more lateral surfaces of the wavelength conversion member; and
a light-transmissive member that is arranged between the light reflection member and the one or more lateral surfaces of the light emitting element;
wherein, in a plan view, the wavelength conversion member is inside a perimeter of the lens portion; and
wherein the light-transmissive member contacts a part of a lower surface of the light-transmissive portion of the wavelength conversion member.

12. The light emitting device according to claim 11,
wherein the light-transmissive member contacts the one or more lateral surfaces of the light emitting element.

13. The light emitting device according to claim 11,
wherein, in a plan view, the light emitting element is within a perimeter of the wavelength conversion portion.

14. The light emitting device according to claim 11,
wherein, in a plan view, at least a portion of the light reflection member is positioned between the wavelength conversion member and a periphery of the lens portion annularly.

15. The light emitting device according to claim 11,
wherein the one or more lateral surfaces of the light-transmissive portion form the one or more lateral surfaces of the wavelength conversion member.

16. The light emitting device according to claim 11,
wherein a thickness of the light reflection member at a periphery of the light emitting element is less than a thickness of the light reflection member at a periphery of the wavelength conversion member.

17. The light emitting device according to claim 16,
wherein the light reflection member has an inclined part that is inclined from the periphery of the wavelength conversion member toward the periphery of the light emitting element.

18. The light emitting device according to claim 11,
wherein the sealing member comprises a flange portion protruding outward from a periphery of the lens portion.

19. The light emitting device according to claim 11,
wherein the upper surface of the wavelength conversion portion and the upper surface of the light-transmissive portion form the upper surface of the wavelength conversion member.

20. The light emitting device according to claim 11,
wherein the wavelength conversion portion comprises a phosphor; and
wherein the light-transmissive portion comprises a transparent glass plate having one surface facing the wavelength conversion portion.

* * * * *